(12) United States Patent
Snyder et al.

(10) Patent No.: US 11,631,808 B2
(45) Date of Patent: Apr. 18, 2023

(54) SYSTEM AND DEVICE INCLUDING MEMRISTOR MATERIAL

(71) Applicant: Rockwell Collins, Inc., Cedar Rapids, IA (US)

(72) Inventors: Kyle B. Snyder, Marion, IA (US); Nathaniel P. Wyckoff, Marion, IA (US); Brandon C. Hamilton, Marion, IA (US); Bruce Rowenhorst, Marion, IA (US); Steven J. Wiebers, Center Point, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 0 days.

(21) Appl. No.: 17/113,406

(22) Filed: Dec. 7, 2020

(65) Prior Publication Data
US 2022/0181548 A1   Jun. 9, 2022

(51) Int. Cl.
*H01L 45/00* (2006.01)
*G11C 13/00* (2006.01)
*H01L 27/24* (2006.01)

(52) U.S. Cl.
CPC ...... *H01L 45/1233* (2013.01); *G11C 13/0007* (2013.01); *G11C 13/0059* (2013.01); *G11C 13/0069* (2013.01); *H01L 27/2481* (2013.01); *H01L 45/1246* (2013.01); *H01L 45/147* (2013.01)

(58) Field of Classification Search
CPC ............ H01L 45/1233; H01L 27/2481; H01L 45/1246; H01L 45/147; G11C 13/0007; G11C 13/0059; G11C 13/0069
See application file for complete search history.

(56) References Cited

U.S. PATENT DOCUMENTS

| | | | |
|---|---|---|---|
| 9,432,298 B1 | 8/2016 | Smith | |
| 9,985,206 B1 | 5/2018 | Ando et al. | |
| 10,332,595 B2 | 6/2019 | Jeon | |
| 10,429,343 B1 | 10/2019 | Talin et al. | |
| 10,454,025 B1 | 10/2019 | Cheng | |
| 10,804,324 B1 | 10/2020 | Zhang et al. | |
| 10,810,506 B1 | 10/2020 | Zota et al. | |

(Continued)

FOREIGN PATENT DOCUMENTS

| | | | |
|---|---|---|---|
| CN | 102611408 B | 12/2014 | |
| CN | 105577355 A | 5/2016 | |

(Continued)

OTHER PUBLICATIONS

Abunahla et al. Integrated graphene oxide resistive element in tunable RF filters Sci Rep 10, 13128 (2020), Published Aug. 4, 2020 (year:2020).

(Continued)

*Primary Examiner* — Jerome Leboeuf
(74) *Attorney, Agent, or Firm* — Suiter Swantz pc llo

(57) ABSTRACT

A system may include an array of interconnected memristors. Each memristor may include a first electrode, a second electrode, and a memristor material positioned between the first electrode and the second electrode. The system may further include a controller communicatively coupled to the array of interconnected memristors. The controller may be configured to tune the array of interconnected memristors.

9 Claims, 25 Drawing Sheets

(56) References Cited

U.S. PATENT DOCUMENTS

| | | |
|---|---|---|
| 2004/0245557 A1 | 12/2004 | Seo et al. |
| 2012/0026776 A1 | 2/2012 | Yang et al. |
| 2012/0091420 A1 | 4/2012 | Kusai et al. |
| 2012/0176831 A1 | 7/2012 | Xiao et al. |
| 2013/0044525 A1 | 2/2013 | Zhang et al. |
| 2013/0121060 A1 | 5/2013 | Lee et al. |
| 2016/0189775 A1 | 6/2016 | Buchanan |
| 2016/0225824 A1 | 8/2016 | Jo et al. |
| 2016/0267970 A1 | 9/2016 | Perner et al. |
| 2016/0336063 A1 | 11/2016 | Buchanan et al. |
| 2016/0351260 A1 | 12/2016 | Buchanan |
| 2016/0351804 A1 | 12/2016 | Campbell |
| 2017/0110187 A1 | 4/2017 | Whitaker |
| 2017/0141160 A1 | 5/2017 | Zhang et al. |
| 2017/0148513 A1 | 5/2017 | Buchanan |
| 2017/0271409 A1 | 9/2017 | Yang et al. |
| 2018/0233196 A1 | 8/2018 | Zidan et al. |
| 2019/0109178 A1 | 4/2019 | Yang et al. |
| 2020/0043938 A1* | 2/2020 | Seidel ............... H01G 4/40 |
| 2020/0066340 A1 | 2/2020 | Sharma et al. |
| 2020/0083440 A1 | 3/2020 | Hersam et al. |
| 2020/0193300 A1* | 6/2020 | Kumar ............... G06N 3/0445 |
| 2020/0395540 A1 | 12/2020 | Lee et al. |
| 2021/0098611 A1 | 4/2021 | Hersam et al. |
| 2021/0125048 A1 | 4/2021 | Jang et al. |
| 2021/0200667 A1 | 7/2021 | Bernstein et al. |
| 2021/0225445 A1 | 7/2021 | Kang et al. |
| 2021/0312984 A1* | 10/2021 | Jo ............... H01L 45/08 |
| 2021/0314176 A1 | 10/2021 | Cambou |
| 2021/0366542 A1 | 11/2021 | Lee et al. |

FOREIGN PATENT DOCUMENTS

| | | |
|---|---|---|
| CN | 106301284 A | 1/2017 |
| CN | 106487355 A | 3/2017 |
| CN | 106603220 A | 4/2017 |
| CN | 106712741 A | 5/2017 |
| CN | 106788329 A | 5/2017 |
| CN | 107743024 A | 2/2018 |
| CN | 108365089 A | 8/2018 |
| CN | 105957963 B | 9/2018 |
| CN | 109743152 A | 5/2019 |
| EP | 2592624 A2 | 5/2013 |
| WO | 2010085241 A1 | 7/2010 |
| WO | 2010062127 A3 | 8/2010 |
| WO | 2012030320 A1 | 3/2012 |
| WO | 2015183291 A1 | 12/2015 |
| WO | 2016064404 A1 | 4/2016 |

OTHER PUBLICATIONS

Arrabito, Giuseppi et al., "Printing ZnO Inks: From Principles to Devices", Crystals, 2020, 10, 449; doi: 10.3390/cryst10060449, Published May 31, 2020, 34 pages.

Strukov, Dmitry B. et al., "The missing memristor found", Nature, vol. 453, May 2008, 4 pages.

Wikipedia, Memristor, Printed Jun. 15, 2020, 34 pages.

Extended Search Report in European Application No. 21195359.1 dated Apr. 19, 2022, 9 pages.

James Alex Pappachen: "An overview of memristive cryptography", European Physical Journal. Special Topics, The, Springer, DE, FR, vol. 228, No. 10, Oct. 1, 2019 (Oct. 1, 2019), pp. 2301-2312, XP036903293, ISSN: 1951-6355, DOI: 10.1140/EPJST/E2019-900044-X [retrieved on Oct. 14, 2019].

Extended Search Report in European Application No. 21195838.4 dated Feb. 7, 2022, 6 pages.

Extended Search Report in European Application No. 21196018.2 dated Feb. 8, 2022, 7 pages.

Extended Search Report in European Application No. 21196035.6 dated Feb. 15, 2022, 7 pages.

Zaman Ayesha et al: "Experimental Study of Memristors for use in Neuromorphic Computing", NAECON 2018—IEEE National Aerospace and Electronics Conference, IEEE, Jul. 23, 2018 (Jul. 23, 2018), pp. 370-374, XP033465765, DOI: 10.1109/NAECON.2018.8556749 [retrieved on Dec. 3, 2018].

Arrabito, Giuseppe et al., "Printing ZnO Inks: From Principles to Devices", Crystals 2020, 10, 449, doi:10.3390/cryst110060449, 34 pages.

Strukov, Dmitri B. et al., "The Missing Memristor Found", Nature, vol. 453, May 1, 2008, doi:10.1038/nature06932, 4 pages.

Wikipedia, Memristor, "The memristor as a fundamental electrical component", Printed Jun. 15, 2020, 34 pages.

* cited by examiner

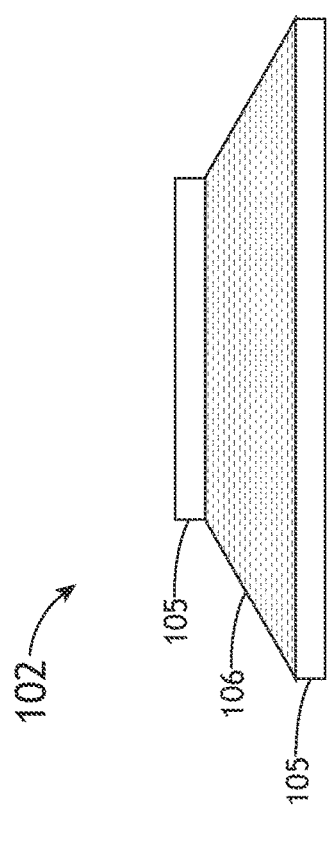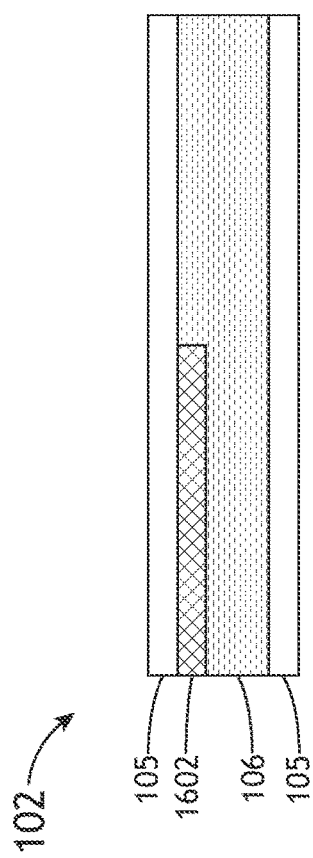

2800

2802 — TUNING, BY A CONTROLLER COMMUNICATIVELY COUPLED TO AN ARRAY OF INTERCONNECTED MEMRISTORS, THE ARRAY OF INTERCONNECTED MEMRISTORS, EACH MEMRISTOR COMPRISING: A FIRST ELECTRODE; A SECOND ELECTRODE; AND AT LEAST ONE MEMRISTOR MATERIAL POSITIONED BETWEEN THE FIRST ELECTRODE AND THE SECOND ELECTRODE

FIG.28

SYSTEM AND DEVICE INCLUDING MEMRISTOR MATERIAL

CROSS-REFERENCE TO RELATED APPLICATIONS

The present application is related to: U.S. application Ser. No. 17/017,313, titled SYSTEM AND DEVICE INCLUDING MEMRISTOR MATERIAL, filed Sep. 10, 2020; U.S. application Ser. No. 17/017,365, titled SYSTEM AND DEVICE INCLUDING MEMRISTOR MATERIAL, filed Sep. 10, 2020; and U.S. application Ser. No. 17/113,329, titled SYSTEM AND DEVICE INCLUDING MEMRISTOR MATERIAL, filed Dec. 7, 2020. U.S. application Ser. Nos. 17/017,313, 17/017,365, and 17/113,329 are herein incorporated by reference in their entirety.

BACKGROUND

Memristors have been the subject of discussion and research, but have not been used in many commercial applications.

SUMMARY

In one aspect, embodiments of the inventive concepts disclosed herein are directed to a system. The system may include an array of interconnected memristors. Each memristor may include a first electrode, a second electrode, and a memristor material positioned between the first electrode and the second electrode. The system may further include a controller communicatively coupled to the array of interconnected memristors. The controller may be configured to tune the array of interconnected memristors.

In a further aspect, embodiments of the inventive concepts disclosed herein are directed to a method. The method may include: tuning, by a controller communicatively coupled to an array of interconnected memristors, the array of interconnected memristors, each memristor comprising: a first electrode; a second electrode; and at least one memristor material positioned between the first electrode and the second electrode.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 15 is an exemplary embodiment of a memristor according to the inventive concepts disclosed herein.

FIG. 16 is an exemplary embodiment of a memristor according to the inventive concepts disclosed herein.

FIG. 28 is a diagram of an exemplary embodiment of a method according to the inventive concepts disclosed herein.

DETAILED DESCRIPTION

Figure 1A:
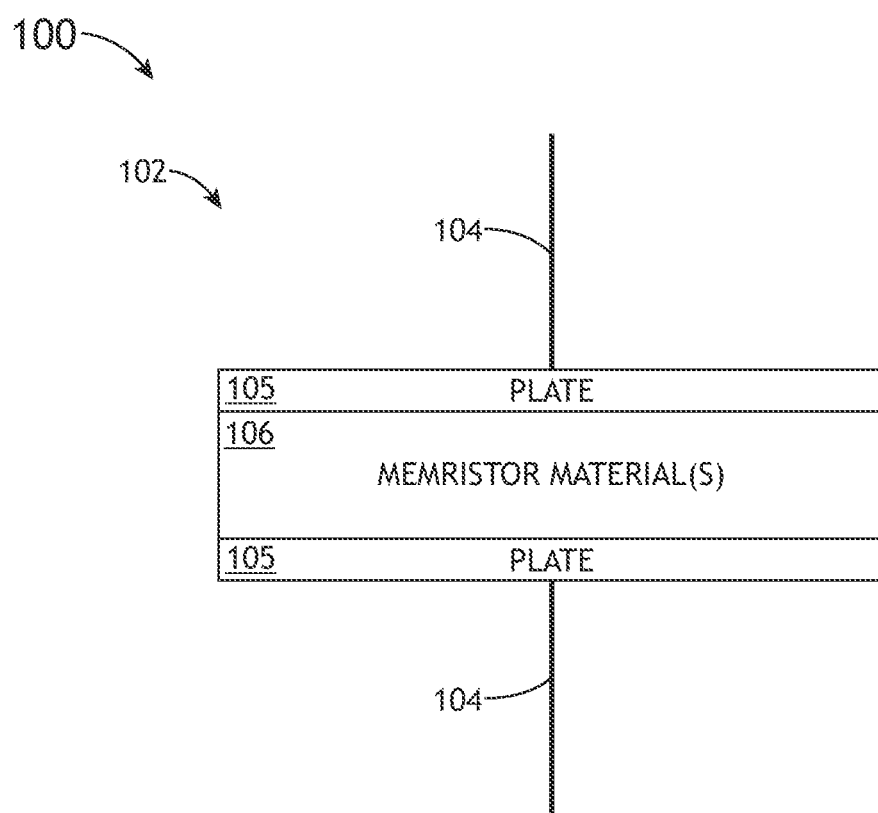
FIG. 1A is a view of an exemplary embodiment of a system including a memristor according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a method and a system including at least one device (e.g., at least one memristor) having at least one memristor material.

In some embodiments, for a memristor element, a desired signal response can be achieved by using (e.g., modifying) at least one particular material (e.g., at least one memristor material) as a transmission medium. In some embodiments, the signal response of the memristor can be modified by controlling an oxygen vacancy transmission rate of the at least one particular material. For example, controlling the oxygen vacancy transmission rate of the at least one particular material can be achieved by a physical modification and/or a chemical modification. In some embodiments, the signal response can provide an asymmetric time based response (e.g., a homogenous asymmetric time based response and/or a compartmentalized asymmetric time based response).

Some embodiments may allow memristor characteristics to be tuned (e.g., tuned in real time during operation) to meet system design needs. Some embodiments may allow memristor elements to be tuned (e.g., additively tuned) around application specific integrated circuit (ASIC) circuitry, sometimes referred to as trimming. Some embodiments may provide circuit modification (e.g., additive circuit modification) of a memristor to improve ASIC shortcomings. Some embodiments may include tuning (e.g., additively tuning) memristor components to address timing specific needs of signal lines (e.g., key signal lines). For example, some embodiments may allow for custom signal optimization to account for a build process of circuit variance.

Some embodiments may include physically changing an order and configuration of memristor structures to develop features with unique electrical responses. For example, by controlling a geometry of a medium that is passing a signal, a movement and effect of oxygen vacancies can be controlled so as to modify a response temporarily or permanently. Such responses can inhibit an asymmetric response, a permanent penalty associated with drive direction, a time based response modification, and/or a combination thereof.

Some embodiments may allow for a potential to provide an element of repeatable uniqueness for use in anti-counterfeiting of electronic devices. Some embodiments may facilitate a generation of behavior based response techniques. Some embodiments may be useful for applications that need unique but repeatable responses (e.g., a unique fingerprint). Some embodiments may provide authenticity validation through unique but repeatable electrical responses.

Some embodiments may include at least one filter (e.g., a high pass filter and/or a low pass filter), which may include at least one memristor instead of a capacitor.

Some embodiments may include an array of memristors, which may be tunable.

Referring now to FIGS. 1A, 1B, 1C, and 1D, exemplary embodiments of a system 100 according to the inventive concepts disclosed herein are depicted. The system 100 may be implemented as any suitable system, such as at least one vehicle system (e.g., at least one aircraft, at least one watercraft, at least one submersible craft, at least one automobile, and/or at least one train), a communication system, an optical system, a computing device system, a multiple computing device system, a radiofrequency (RF) device system, and/or a multiple RF device system.

Figure 1B:
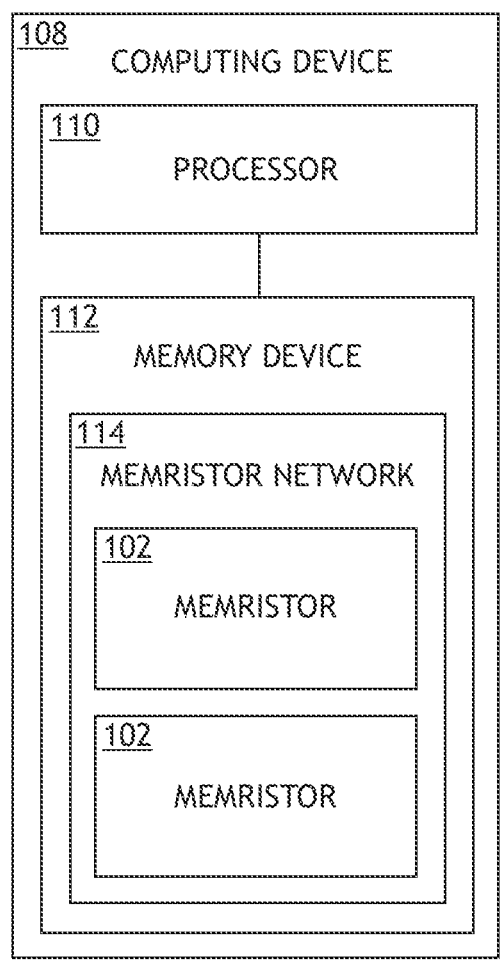
FIG. 1B is a view of an exemplary embodiment of the system of FIG. 1A including a memristor according to the inventive concepts disclosed herein.
Figure 1C:
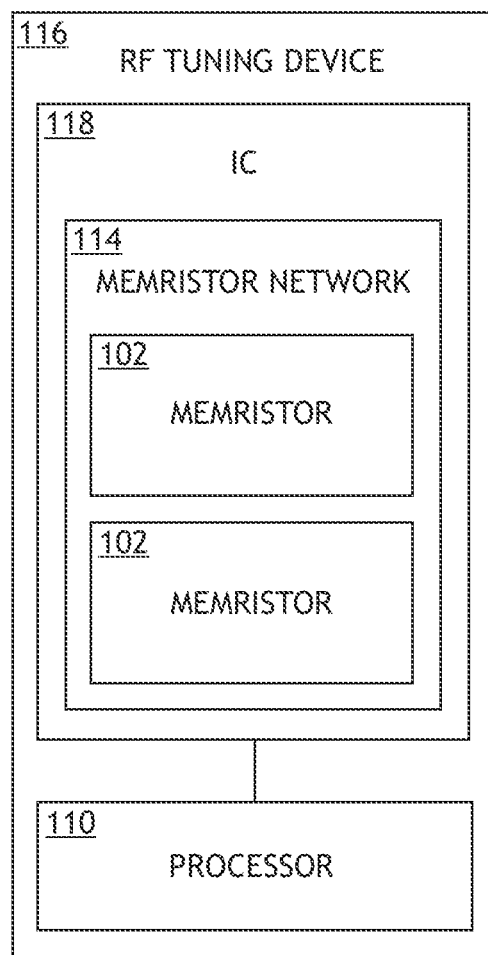
FIG. 1C is a view of an exemplary embodiment of the system of FIG. 1A including a memristor according to the inventive concepts disclosed herein.
Figure 1D:
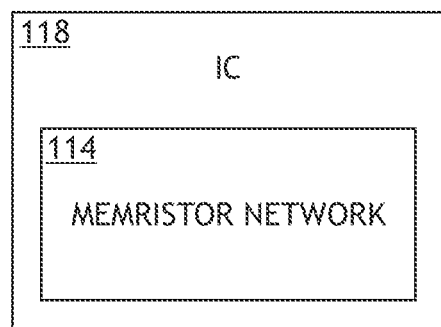
FIG. 1D is a view of an exemplary embodiment of the system of FIG. 1A including a memristor according to the inventive concepts disclosed herein.

For example, as shown in FIG. 1A, the system 100 may include at least one device (e.g., at least one memristor 102) including at least two terminals 104, at least two conductive plates 105, and/or at least one memristor material 106. Some or all of the at least one memristor 102 and/or any other components of the system 100 may be communicatively coupled at any given time. Some embodiments may include multiple memristors 102 implemented as a memristor network 114 (as shown in FIGS. 1B-1D). For example, the memristor network 114 may include a plurality of at least partially communicatively coupled (e.g., at least partially interconnected) memristors 102 that may be arranged in an array, in parallel, and/or in series. In some embodiments, the at least one memristor 102 may be fabricated on an integrated circuit (IC) device (e.g., IC 118, as shown in FIGS.

1C-1D). In some embodiments, the at least one memristor 102 may be part of a memory device (e.g., 112, as shown in FIG. 1B).

For example, a first conductive plate 105 may be configured at least to receive an input signal via a first terminal 104; and a second conductive plate 105 may be configured at least to output an output signal via a second terminal 104. For example, the at least one memristor material 106 may be positioned between the first conductive plate 105 and the second conductive plate 105.

In some embodiments, the at least one memristor material 106 may be composed of any suitable memristor material, such as any suitable ionic-covalent metal compound. For example, each of the at least one memristor material 106 may comprise at least one of: at least one metal oxide (e.g., $TiO_2$, $ZrO_2$, NiO, CuO, CoO, $Fe_2O_3$, MoO, $VO_2$, and/or $HfO_2$), at least one metal sulfide, at least one metal selenide, at least one metal telluride, at least one metal nitride, at least one metal phosphite, and/or at least one metal arsenide. $TiO_2$, $ZrO_2$, NiO, CuO, CoO, $Fe_2O_3$, MoO, $VO_2$, and $HfO_2$ are known in the art to be suitable memristor materials. Each memristor material 106 may have oxygen vacancy and/or anion vacancy characteristics. Oxygen vacancy refers to a point defect in a crystal or glass where an oxygen ion is missing at an expected lattice or structure position, which results in a net positive charge, a trapped electron, and a metastable atomic structure. Anion vacancy refers to a point defect in a crystal or glass where an anion ion is missing at an expected lattice or structure position, which results in a net positive charge, a trapped electron, and a metastable atomic structure.

For example, as shown in FIG. 1B, the system 100 may include at least one computing device 108. If the system 100 includes multiple computing devices 108, some or all of the computing devices 108 may be communicatively coupled at any given time.

In some embodiments, the computing device 108 may include at least one processor 110 and/or at least one memory device 112, some or all of which may be communicatively coupled at any given time. In some embodiments, each of the processor 110 and/or the memory device 112 may include at least one circuit (e.g., at least one IC 118, as shown in FIGS. 1C-1D).

The at least one processor 110 may be implemented as any suitable type and number of processors. For example, the at least one processor 110 may include at least one general purpose processor (e.g., at least one central processing unit (CPU)), at least one digital signal processor (DSP), at least one application specific integrated circuit (ASIC), at least one field-programmable gate array (FPGA), at least one complex programmable logic device (CPLD), and/or at least one graphics processing unit (GPU). The at least one processor 110 may be configured to perform (e.g., collectively perform if more than one processor) any or all of the operations disclosed throughout. The processor 110 may be configured to run various software and/or firmware applications and/or computer code stored (e.g., maintained) in a non-transitory computer-readable medium (e.g., memory device 112) and configured to execute various instructions or operations. For example, the at least one processor 110 may be configured to: output a signal; receive a signal; output data to the memory device 112; receive data from the memory device 112; determine and/or use a signature of a received signal; perform anti-piracy operations based at least on the signature; perform cyber security authentication operations based at least on the signature; perform unique data storage operations based at least on the signature; perform usage temperature authentication operations based at least on the signature; cause a barrier material to be fused; and/or cause an activation of at least one of a blocking material, a permanent modification material, or a transfer rate modification material.

The memory device 112 may include the at least one memristor 102, which may be implemented as the memristor network 114 if more than one memristor 102. For example, the memory device 112 may be a non-volatile and/or persistent memory device. For example, the memory device 112 may be configured to: store data; read data; write data; output data; receive data; receive input signals; output output signals; determine and/or use a signature of a received signal; perform anti-piracy operations based at least on the signature; perform cyber security authentication operations based at least on the signature; perform unique data storage operations based at least on the signature; perform usage temperature authentication operations based at least on the signature; cause a barrier material to be fused; and/or cause an activation of at least one of a blocking material, a permanent modification material, or a transfer rate modification material For example, as shown in FIG. 1C, the system 100 may include at least one RF tuning device 116. If the system 100 includes multiple RF tuning devices 116, some or all of the RF tuning devices 116 may be communicatively coupled at any given time.

In some embodiments, the RF tuning device 116 may include at least one processor 110, at least one IC 118, and/or at least one memory device 112, some or all of which may be communicatively coupled at any given time. In some embodiments, each of the processor 110, the IC 118, and/or the memory device 112 may include at least one circuit (e.g., at least one IC 118, as shown in FIGS. 1C-1D). The RF tuning device 116 may be configured to tune RF signal outputs.

The at least one processor 110 may be implemented similarly and function similarly to the processor 110 shown in FIG. 1B, except that the at least one processor 110 may be further configured to cause RF tuning operations to be performed.

The IC 118 may include the at least one memristor 102, which may be implemented as the memristor network 114 if more than one memristor 102. The at least one IC 118 may be configured to perform (e.g., collectively perform if more than one IC) any or all of the operations disclosed throughout. The IC 118 may be configured to run various software and/or firmware applications and/or computer code stored (e.g., maintained) in a non-transitory computer-readable medium (e.g., memory device 112) and configured to execute various instructions or operations. For example, the IC 118 may be configured to: output a signal; receive a signal; output data to the memory device 112; receive data from the memory device 112; determine and/or use a signature of a received signal; perform anti-piracy operations based at least on the signature; perform cyber security authentication operations based at least on the signature; perform unique data storage operations based at least on the signature; perform usage temperature authentication operations based at least on the signature; cause a barrier material to be fused; cause an activation of at least one of a blocking material, a permanent modification material, or a transfer rate modification material; and/or perform RF signal tuning operations.

For example, as shown in FIG. 1D, the system 100 may include at least one circuit (e.g., at least one IC 118). If the system 100 includes multiple ICs 118, some or all of the ICs 118 may be communicatively coupled at any given time. The at least one IC 118 may be implemented similarly and function similarly to the IC 118 shown in and described with respect to FIG. 1C.

Referring now to FIGS. 2-6, exemplary embodiments of the system 100 including at least one memristor 102 according to the inventive concepts disclosed herein are depicted.

Figure 2:
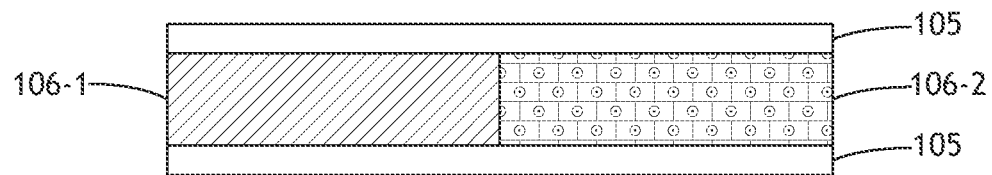
FIG. 2 is an exemplary embodiment of a memristor according to the inventive concepts disclosed herein.

Referring now to FIG. 2, an exemplary embodiment of at least one memristor 102 according to the inventive concepts disclosed herein is depicted.

For example, the memristor 102 may include a first conductive plate 105 configured at least to receive an input signal, a second conductive plate 105 configured at least to output an output signal, and at least two memristor materials (e.g., a first memristor material 106-1 and a second memristor material 106-2). The first memristor material 106-1 may be positioned between the first conductive plate 105 and the second conductive plate 105. The second memristor material 106-2 may be positioned between the first conductive plate 105 and the second conductive plate 105. The first memristor material 106-1 and the second memristor material 106-2 may be in parallel electrically. The first memristor material 106-1 may be different from the second memristor material 106-2. For example, the first memristor material 106-1 may be a relatively slower or faster response material than the second memristor material 106-2. Memristor response may depend on the crystal chemistry, crystal phase, the amount of underproportination and disproportionation, etc. Memristor response may be influenced by the cation-anion bond strength and the cation-anion size ratio. The responsiveness of the memristor materials 106 can be measured. In some embodiments, the responsiveness of the memristor materials 106 can be approximated by Gibbs Free Energy of Formation since Gibbs Free Energy of Formation incorporates several energy well/barrier type quantities. Based on approximated responsiveness using Gibbs Free Energy of Formation, some examples of memristor materials 106 ordered from relatively slower approximated responsiveness to relatively faster approximated responsiveness are: $Ti_2O_3$ at $-11,133,903$ $\Delta Gf°$ (kJ/mol); $Ta_2O_5$ at $-1,910,984$ $\Delta Gf°$ (kJ/mol); $Sc_2O_3$ at $-1,819,371$ $\Delta Gf°$ (kJ/mol); $Nb_2O_5$ at $-1,765,859$ $\Delta Gf°$ (kJ/mol); $TiO_2$ (Rutile) at $-889,446$ $\Delta Gf°$ (kJ/mol); $TiO_2$ (Anatase) at $-883,303$ $\Delta Gf°$ (kJ/mol); $NbO_2$ at $-739,194$ $\Delta Gf°$ (kJ/mol); $MgO$ at $-569,196$ $\Delta Gf°$ (kJ/mol); and $NbO$ at $-391,945$ $\Delta Gf°$ (kJ/mol).

In some embodiments, the first memristor 106-1 material has a first current-voltage (I-V) curve, the second memristor material 106-2 has a second I-V curve, and the memristor 102 has a third I-V curve, wherein each of the first, second, and third I-V curves are different. For example, as shown in FIG. 2, the third I-V curve is indicative of an asymmetric time-based response (e.g., a homogenous asymmetric time-based response). In some embodiments, the output signal of the memristor 102 may have a signature based at least on the asymmetric time-based response. For example, the signature may be at least semi-unique (e.g., unique, unique to a product, or unique to a manufacturer) and/or may be indicative of at least one of an identity or an authenticity of an electronic component or device. In some embodiments a circuit (e.g., an IC 118) may be configured to receive and use the signature of the output signal for at least one of: anti-piracy, cyber security authentication, unique data storage, electronic serialization, or usage temperature authentication (e.g., by fusing the barrier material 302). For example, the signature can be achieved by strategically selection of the at least two memristor materials (e.g., 106-1, 106-2), dimensions of the at least two memristor materials (e.g., 106-1, 106-2), and/or an arrangement of the at least two memristor materials (e.g., 106-1, 106-2). For example, the signature may be used as an identification feature for part authentication.

Figure 3:
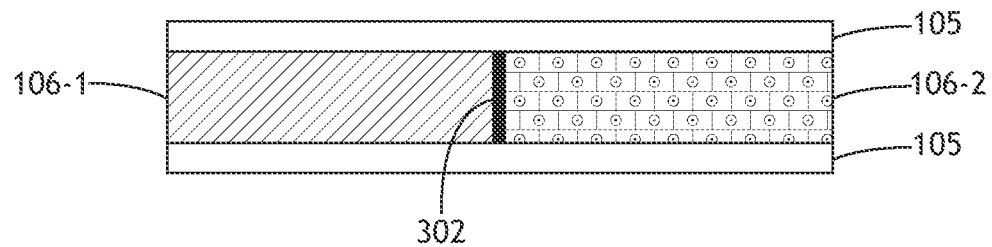
FIG. 3 is an exemplary embodiment of a memristor according to the inventive concepts disclosed herein.

Referring now to FIG. 3, an exemplary embodiment of at least one memristor 102 according to the inventive concepts disclosed herein is depicted.

For example, the memristor 102 may be implemented similarly and function similarly to the memristor of FIG. 2, except that the memristor 102 of FIG. 3 may include at least one barrier material 302.

For example, the barrier material 302 may extend from the first conductive plate 105 to the second conductive plate 105. The barrier material 302 may be positioned between the first memristor material 106-1 and the second memristor material 106-2 such that the first memristor material 106-1 is not in contact with the second memristor material 106-2. In some embodiments, the barrier material 302 may be a fuse configured to permanently configure the memristor 102, for example, that may be activated thermally. For example, some embodiments of suitable barrier materials may include any noble metal (e.g., Au, Pt, Ag, Ir, Rh, Ru, Pd, and/or Os), highly covalently bonded material (e.g., carbon allotropes, silicon allotropes, Ge, Te, and/or Se, etc. . . . ), mostly elemental forms of nonmetals and metalloids which form solids at standard temperature and pressure (STP) for periodic table groups 14, 15, and 16, or some combination thereof.

In some embodiments, the first memristor 106-1 material has a first current-voltage (I-V) curve, the second memristor material 106-2 has a second I-V curve, and the memristor 102 has a third I-V curve, wherein each of the first, second, and third I-V curves are different. For example, as shown in FIG. 2, the third I-V curve is indicative of an asymmetric time-based response (e.g., a compartmentalized asymmetric time-based response). In some embodiments, the output signal of the memristor 102 may have a signature based at least on the asymmetric time-based response. For example, the signature may be at least semi-unique (e.g., unique, unique to a product, or unique to a manufacturer) and/or may be indicative of at least one of an identity or an authenticity of an electronic component or device. In some embodiments, a circuit (e.g., an IC 118) may be configured to receive and use the signature of the output signal for at least one of: anti-piracy, cyber security authentication, unique data storage, electronic serialization, or usage temperature authentication (e.g., by fusing the barrier material 302). For example, the signature can be achieved by strategic selection of the at least two memristor materials (e.g., 106-1, 106-2), dimensions of the at least two memristor materials (e.g., 106-1, 106-2), and/or an arrangement of the at least two memristor materials (e.g., 106-1, 106-2). For example, the signature may be used as an identification feature for part authentication.

Figure 4:
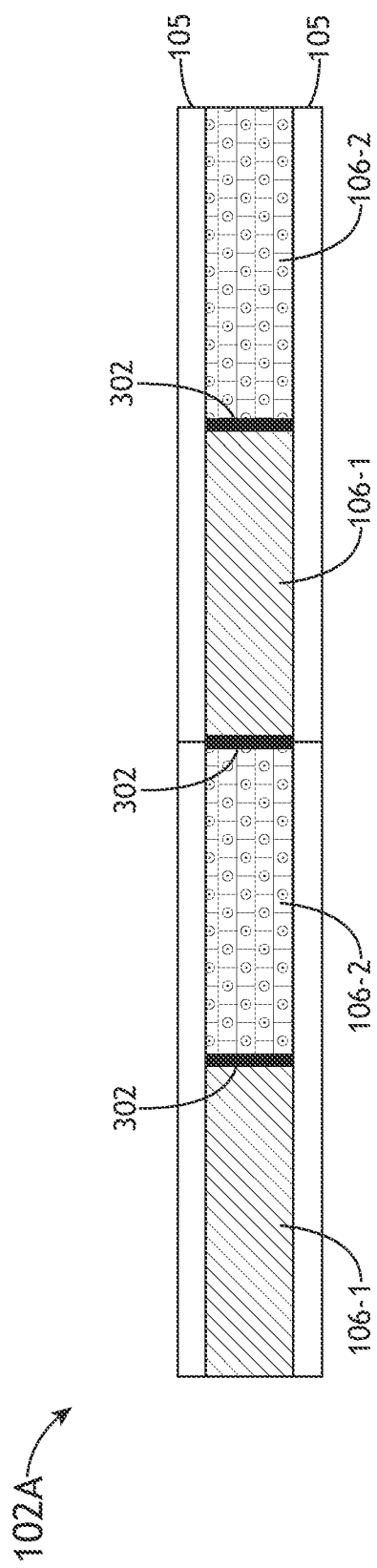
FIG. 4 is an exemplary embodiment of a memristor according to the inventive concepts disclosed herein.

Referring now to FIG. 4, an exemplary embodiment of at least one memristor 102 according to the inventive concepts disclosed herein is depicted.

For example, the memristor 102 may be implemented similarly and function similarly to the memristor of FIGS. 2 and/or 3, except that the memristor 102 of FIG. 4 may include at least two of the first memristor material 106-1, at least two of the second memristor material 106-2, and at least two barrier material 302. For example, the first memristor material 106-1 sections, the second memristor material 106-2 sections, and barrier material 302 sections may be interspersed (e.g., in one dimension or two dimensions (e.g., in a two-dimensional array)). In some embodiments, one or more of the barrier material 302 sections may be omitted. In some embodiments, the memristor 102 may include more than one (e.g., two, three, four, or more) type of memristor material 106.

Referring to FIGS. 3-4, in some embodiments, the barrier material 302 may be used to permanently change the memristor 102. For example, the barrier material 302 may be used to permanently change a phase of the memristor 102.

For example, the barrier material 302 may be used to permanently configure the memristor 102, for example, to set the memristor 102 to a known value. For example, the barrier material 302 may be activated thermally and act as a fusing structure. In some embodiments, different materials for the memristor materials 106-1, 106-2 and/or the barrier material(s) 302 may be used to control a speed of and an amount of oxygen depletion transfer.

In some embodiments, memristors 102 may be arranged in an array as a memristor network 114. For example, the memristor network 114 (e.g., which may be implemented in the RF tuning device 116) may be used for configuring test values (e.g., resistance values). For example, the memristor network 114 may be used to tune a circuit (e.g., an IC 118, such as an ASIC) by trimming resistance values (e.g., by using test selects). For example, the memristor network 114 may be used to tune a resistor-capacitor (RC) circuit delay. For example, such tuning may be similar to how mixed signals circuits are tuned by swapping resistors after a characterization test is complete, then retesting for proper performance. In some embodiments, the memristor network 114 may be configured as multiple interconnected memristors 102 or as a single memristor 102 having multiple fuseable barrier materials 302. In some embodiments, one memristor 102 of the memristor network 114 may influence another memristor 102 of the memristor network 114, for example, based on a fusing of a barrier material 302.

In some embodiments, at least one memristor 102 having at least one barrier material 302 may be used in the memory device 112 (e.g., a non-volatile memory device).

Figure 5:
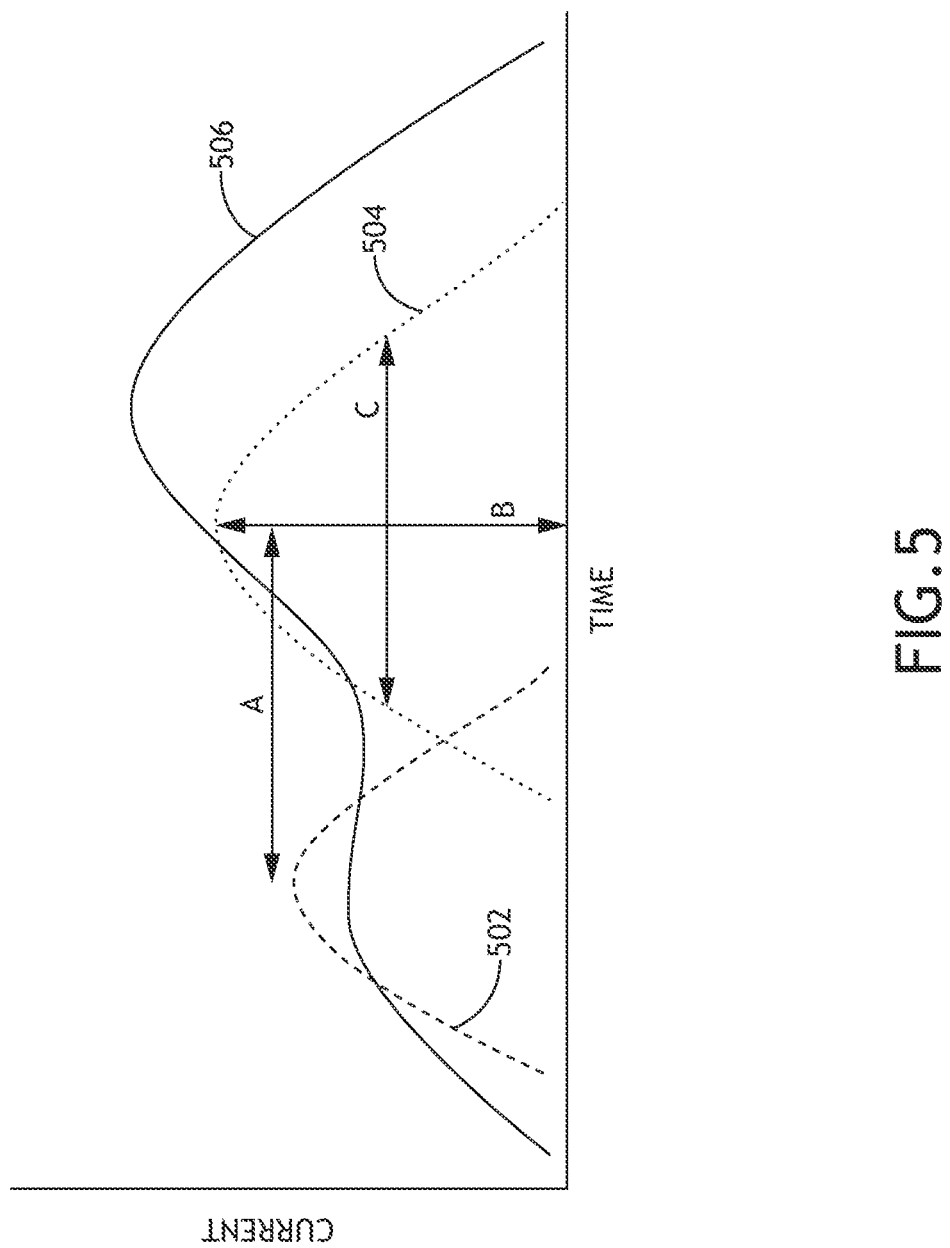
FIG. 5 is an exemplary graph according to the inventive concepts disclosed herein.

Referring now to FIG. 5, an exemplary graph of current versus time is shown. The graph shows a first curve 502, a second curve 504, and a third curve 506. The first curve 502 demonstrates a responsiveness of the first memristor material 106-1. The second curve 504 demonstrates a responsiveness of the second memristor material 106-2. The third curve 506 demonstrates a responsiveness of the memristor 102 having the first memristor material 106-1 and the second memristor material 106-2. The third curve 506 may be indicative of an asymmetric time-based response (e.g., a homogenous asymmetric time-based response and/or a compartmentalized asymmetric time-based response) that may be associated with a signature as discussed herein.

Figure 6:
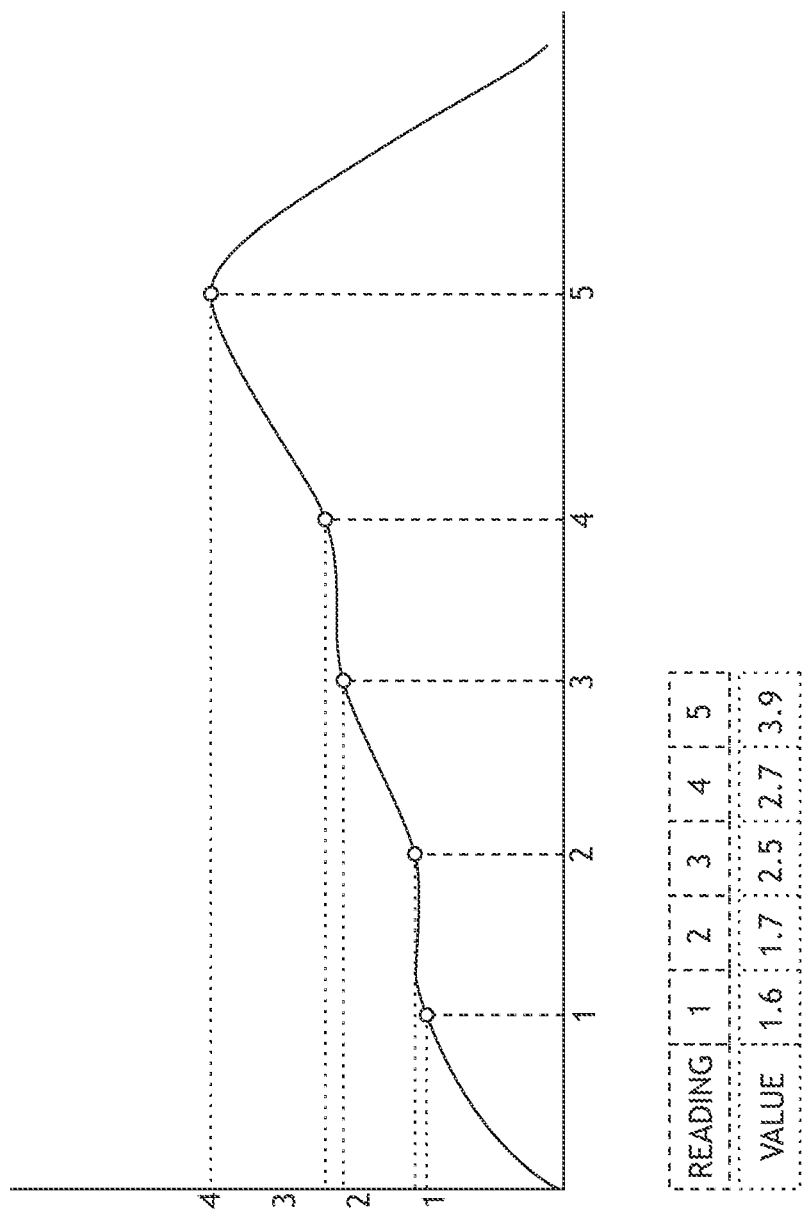
FIG. 6 is an exemplary graph according to the inventive concepts disclosed herein.

Referring now to FIG. 6, an exemplary graph of current versus time for a memristor 102 is shown. For example, values of the output current for the memristor 102 can be read at various times (e.g., 5 times, as shown). The combination of the values read at different times can be used as a signature as discussed herein.

Referring now to FIGS. 7-19, exemplary embodiments of the system 100 including at least one memristor 102 according to the inventive concepts disclosed herein are depicted. Each memristor 102 may include at least one blocking material 602, at least one permanent modification material 902, and/or at least one transfer rate modification material 702.

In some embodiments, a blocking material 602 may be any suitable material that does not permit transmission of a memristor charge carrying mechanism. Some examples of suitable blocking materials 602 include gold (Au), platinum (Pt), and/or palladium (Pd).

In some embodiments, a permanent modification material 902 may be any suitable material that absorbs memristor charge carriers. An example may be a cation oxidation number change that results in absorption or generation of total oxygen vacancies. Some examples of suitable permanent modification materials 902 may include a metal oxide (e.g., a metal oxide near the surface of the electrode whose cation is reduced to its metallic form and whose anion fills the oxygen vacancy), such as a noble metal oxide.

In some embodiments, a transfer rate modification material 702 may be any suitable material that changes a transmission rate of memristor charge carriers. An example may be a transient or residual crystallographic phase change which results in a change in oxygen vacancy transmission rate. For example, a transfer rate modification material 702 may be implemented by depositing a material in a metastable crystal phase or glassy phase (which may be inherently metastable) such that a thermal or optical stimulus initiates a phase shift to the more stable phase at the usage temperature. Depositing in a metastable phase can be accomplished by modifying the deposition rate, substrate biasing, and/or deposition pressure. Since the oxygen vacancy conduction rate is dependent on the crystal phase, the memristor response will be different after the phase transformation. In some embodiments, for such an example, $TiO_2$ in Rutile and Anatase may have a different memristor response since the bond strength is different and the crystal geometry is different. Additionally, for example, a transfer rate modification material 702 may be implemented by depositing a material that has a crystal phase transition over the operation temperature. In this embodiment the memristor response would change discontinuously at the temperature where the crystal phase changes. For example, $VO_2$ has a monoclinic to tetragonal crystal phase transition around 67 degrees Celsius and may be a suitable transfer rate modification material 702.

Figure 7:
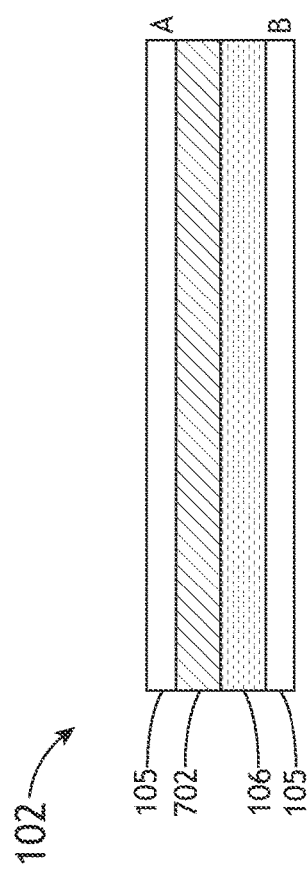
FIG. 7 is an exemplary embodiment of a memristor according to the inventive concepts disclosed herein.

Referring now to FIG. 7, an exemplary embodiment of at least one memristor 102 according to the inventive concepts disclosed herein is depicted. The memristor 102 may be implemented similarly and function similarly to the memristor 102 of FIG. 1A, except that the memristor 102 of FIG. 7 may include at least one transfer rate modification material 702.

In some embodiments, the transfer rate modification material 702 may be positioned between the first conductive plate 105 and the second conductive plate 105. At least a portion of the transfer rate modification material 702 may abut the memristor material 106. The transfer rate modification material 702 may provide a shift in a stabilization time to the output signal after a signal is driven from the second conductive plate 105 (B) to the first conductive plate 105 (A).

Figure 8:
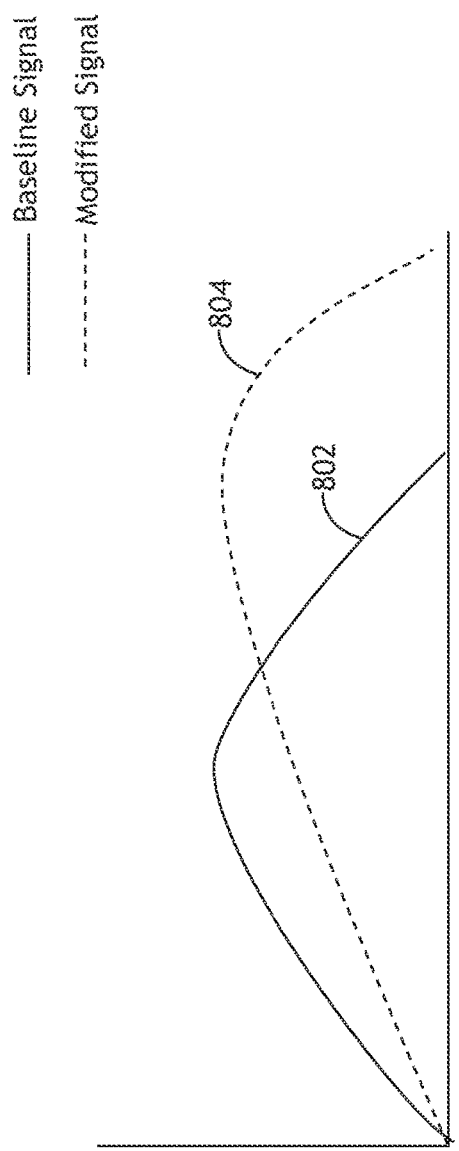
FIG. 8 is an exemplary graph according to the inventive concepts disclosed herein.

Referring now to FIG. 8, an exemplary graph of current versus time is shown. The graph shows a first curve 802 and a second curve 804. The first curve 802 is associated with a baseline signal (e.g., an unmodified signal) before activation of the transfer rate modification material 702. The second curve 804 is associated with a modified signal after activation of the transfer rate modification material 702. For example, this modification may result in a modified output signal from the first conductive plate 105 (A) to the second conductive plate 105 (B).

Figure 9:
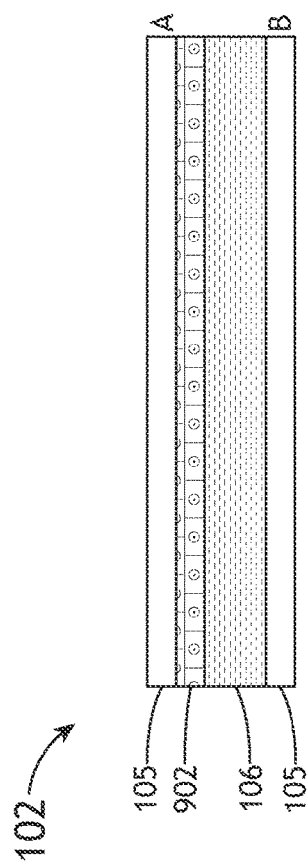
FIG. 9 is an exemplary embodiment of a memristor according to the inventive concepts disclosed herein.

Referring now to FIG. 9, an exemplary embodiment of at least one memristor 102 according to the inventive concepts disclosed herein is depicted. The memristor 102 may be implemented similarly and function similarly to the memristor 102 of FIG. 1A, except that the memristor 102 of FIG. 9 may include at least one permanent modification material 902.

In some embodiments, the permanent modification material 902 may be positioned between the first conductive plate 105 and the second conductive plate 105. At least a portion of the permanent modification material 902 may abut the memristor material 106. The permanent modification material 902 may provide a permanent signal modification (e.g., a permanent uniform signal modification) to the output signal after a signal is driven from the second conductive plate 105 (B) to the first conductive plate 105 (A). For example, this modification may result in a modified output signal from the first conductive plate 105 (A) to the second conductive plate 105 (B). Each subsequent activation (e.g., by driving a signal from the second conductive plate 105 (B) to the first conductive plate 105 (A)) of the permanent modification material 902 may compound modification effects.

Figure 10:
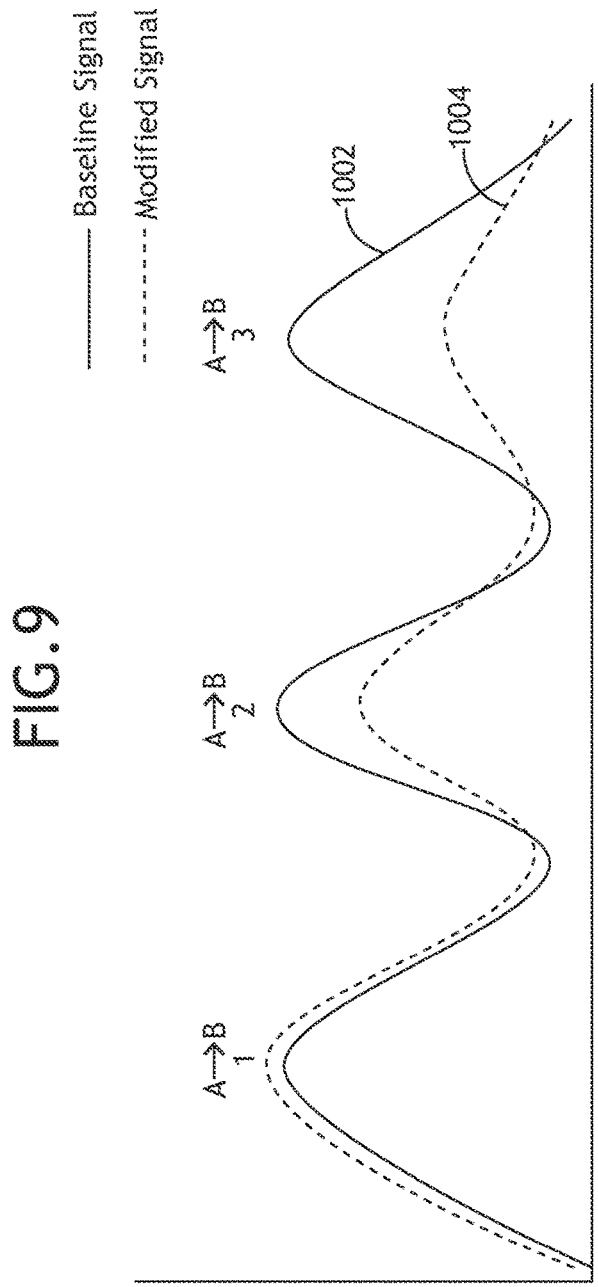
FIG. 10 is an exemplary graph according to the inventive concepts disclosed herein.

Referring now to FIG. 10, an exemplary graph of current versus time is shown. The graph shows a first curve 1002 and a second curve 1004. The first curve 1002 is associated with a baseline signal (e.g., an unmodified signal) before activation of the permanent modification material 902. The second curve 1004 is associated with a modified signal after activation of the permanent modification material 902.

Figure 11:
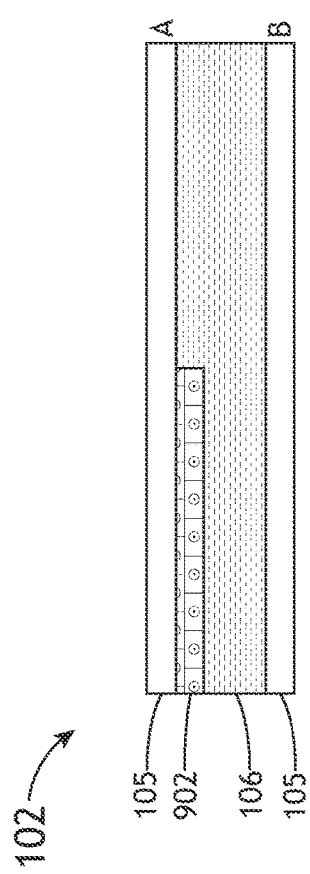
FIG. 11 is an exemplary embodiment of a memristor according to the inventive concepts disclosed herein.

Referring now to FIG. 11, an exemplary embodiment of at least one memristor 102 according to the inventive concepts disclosed herein is depicted. The memristor 102 may be implemented similarly and function similarly to the memristor 102 of FIG. 9, except that the at least one permanent modification material 902 does not fully extend along the first plate 105 (A). For example, the memristor material 106 may abut a first surface area of the first conductive plate 105 (A). The memristor material 106 may abut a second surface area of the second conductive plate 105 (B). The first surface area and the second surface area may be different. The permanent signal modification may be a permanent asymmetric signal modification.

Figure 12:
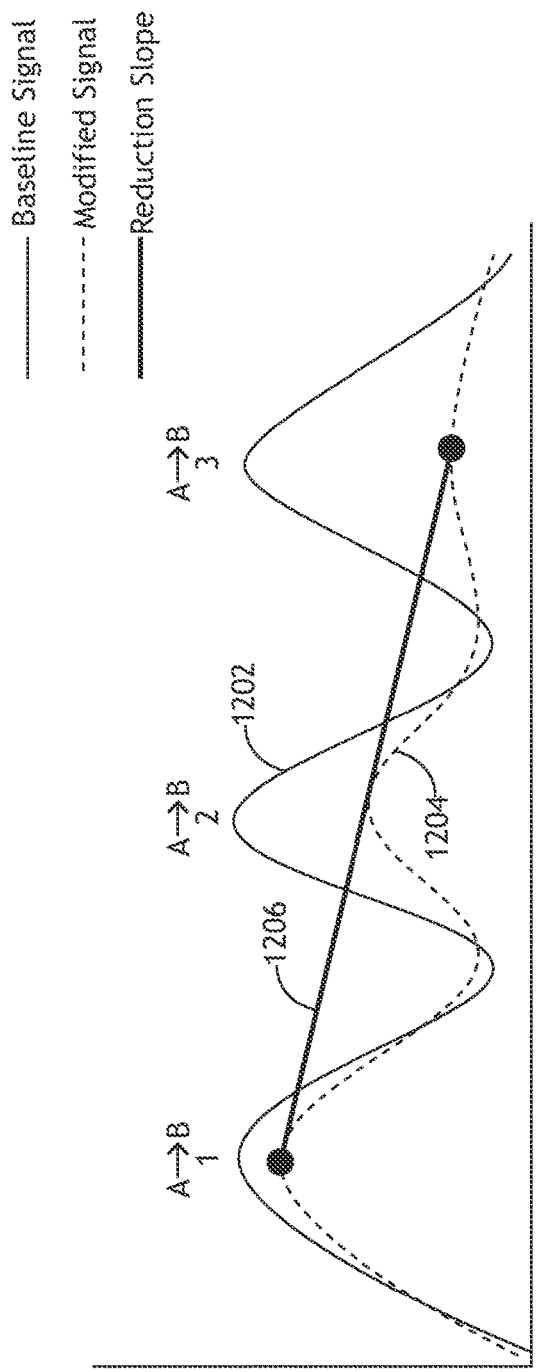
FIG. 12 is an exemplary graph according to the inventive concepts disclosed herein.

Referring now to FIG. 12, an exemplary graph of current versus time is shown. The graph shows a first curve 1202, a second curve 1204, and a reduction slope 1206. The first curve 1202 is associated with a baseline signal (e.g., an unmodified signal) before activation of the permanent modification material 902. The second curve 1204 is associated with a modified signal after activation of the permanent modification material 902.

Figure 13:
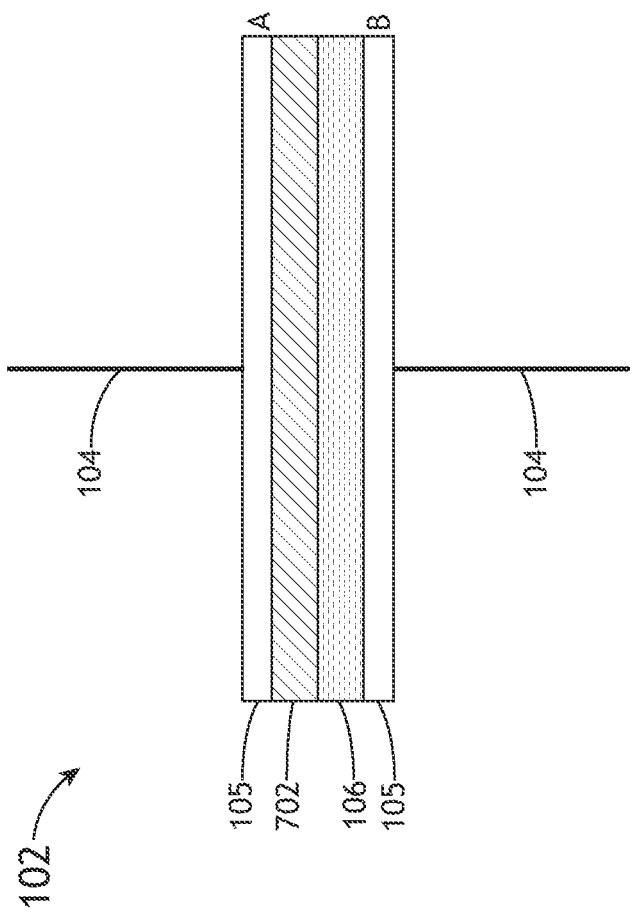
FIG. 13 is an exemplary embodiment of a memristor according to the inventive concepts disclosed herein.

Referring now to FIG. 13, an exemplary embodiment of at least one memristor 102 according to the inventive concepts disclosed herein is depicted. The memristor 102 may be implemented similarly and function similarly to the memristor of FIG. 7, except that the memristor 102 may be a notch filter.

Figure 14:
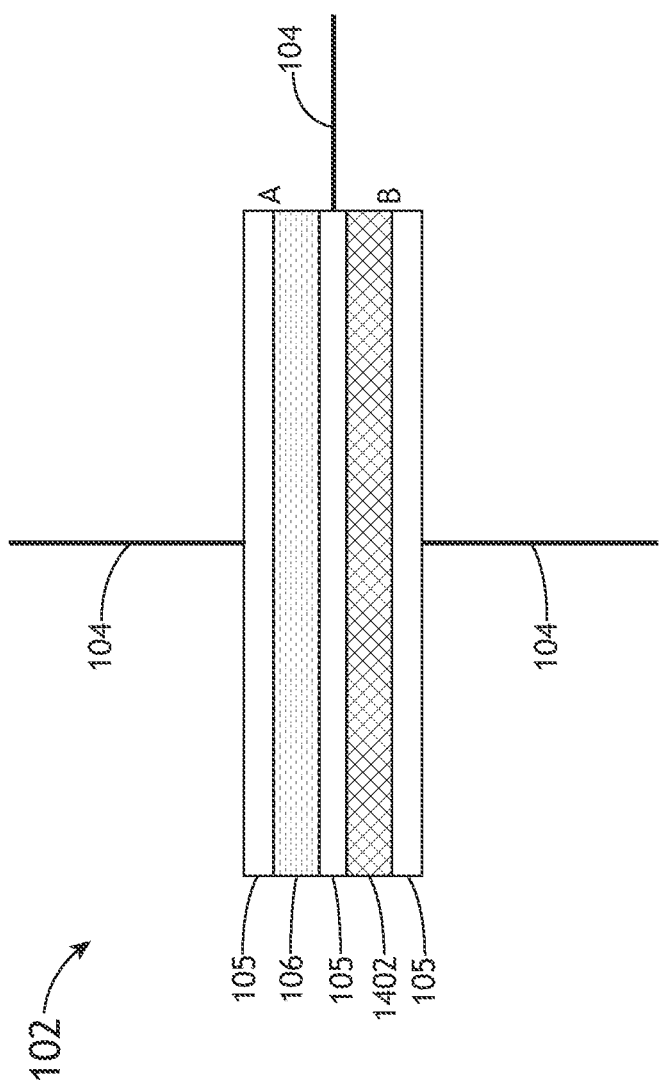
FIG. 14 is an exemplary embodiment of a device according to the inventive concepts disclosed herein.

Referring now to FIG. 14, an exemplary embodiment of at least one device 102A according to the inventive concepts disclosed herein is depicted. The device 102A may be implemented similarly and function similarly to the memristor 102 of FIG. 7, except that the device 102A may further include at least one dielectric material 1402, a third conductive plate 105, and a third terminal 104.

The device 102A may include the first conductive plate 105, the second conductive plate 105, the memristor material 106, a third conductive plate 105, a dielectric material 1402, a first terminal 104 electrically coupled to the first conductive plate 105, a second terminal 104 electrically coupled to the second conductive plate 105, and a third terminal 104 electrically coupled to the third conductive plate 105. The dielectric material 1402 may be positioned between the second conductive plate 105 and the third conductive plate 105. The device 102A may have memristor functionality and capacitor functionality. The device 102 may be a bandpass filter, which for example, may be combined RC time constant.

Referring now to FIGS. 15-16, exemplary embodiments of at least one memristor 102 according to the inventive concepts disclosed herein are depicted. The memristor 102 may be implemented similarly and function similarly to the memristor of FIG. 1A, except that in FIGS. 15-16: the memristor material 106 may abut a first surface area of the first conductive plate 105 (A); the memristor material 106 may abut a second surface area of the second conductive plate 105 (B); and the first surface area and the second surface area may be different (e.g., the first surface area may be less the second surface area as shown in FIGS. 15-16). In some embodiments, the memristor of FIGS. 15-16 may provide an asymmetric signal response. For example, the response can be modified to create greater oxygen vacancy density on the first conductive plate 105 (A) and lower density on the second conductive plate 105 (B). For example, such asymmetric application can be tailored by modification of a location and an amount of surface area covered by the blocking material 1602 (as shown in FIG. 16).

In some embodiments, the asymmetric response of the memristor 102 of FIGS. 15-16 can be used for: phase shifting an input signal (e.g., a digital clock phase shift); filtering by using only resistive elements; control system feedback; integrated analog compensation for undesired hysteresis effects (e.g., a lag in a temperature sensor reading versus actual instantaneous temperature) that can reduce or eliminate a need to compensate for such effects through software.

As shown in FIG. 15, opposing faces of the first and second conductive plates 105 may have different surface areas.

As shown in FIG. 16, the memristor 102 may further include a blocking material 1602. The blocking material 1602 may be positioned between the first conductive plate 105 and the second conductive plate 105. The blocking material 1602 may abut the memristor material 106 and one of the first conductive plate 105 or the second conductive plate 105.

Figure 17:
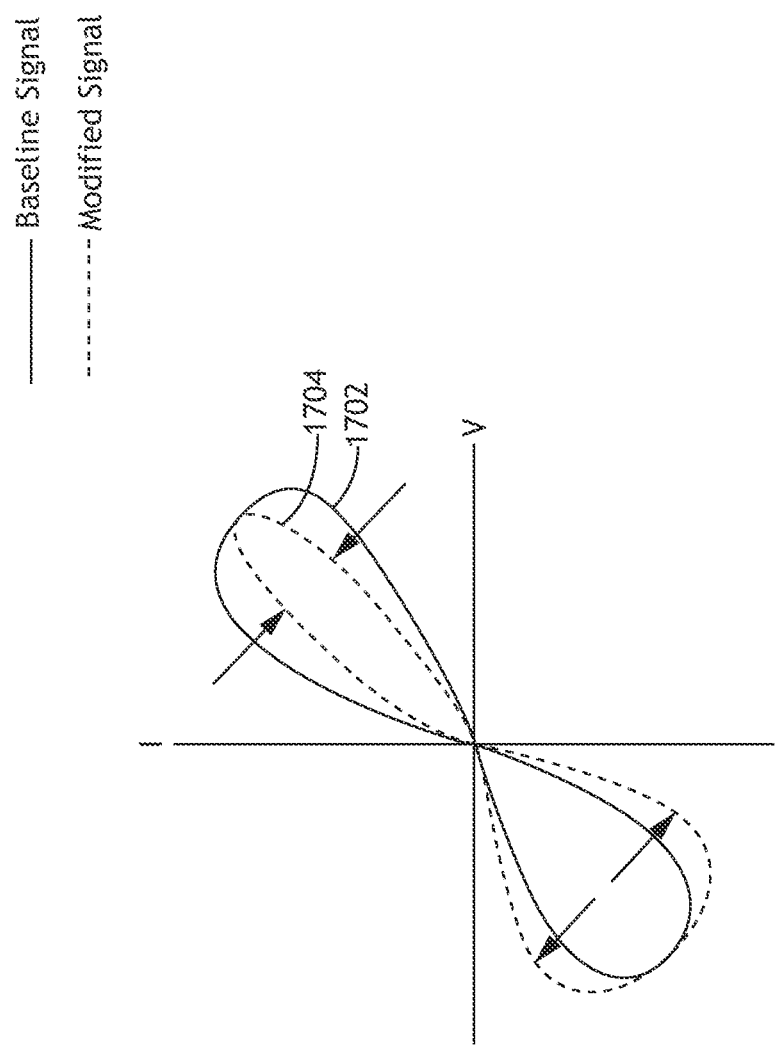
FIG. 17 is an exemplary graph according to the inventive concepts disclosed herein.

Referring now to FIG. 17, an exemplary graph of current (I) versus voltage (V) is shown. The graph shows a first I-V curve 1702 and a second I-V curve 1704. The first I-V curve 1702 is associated with a baseline signal (e.g., an unmodified signal) of a hypothetical memristor 102 with a first surface area of the first conductive plate 105 equal to the second surface area of the second conductive plate 105. The second I-V curve 1704 may be an I-V curve for the output signal of the memristor 102 of FIGS. 15-16.

Figure 18:
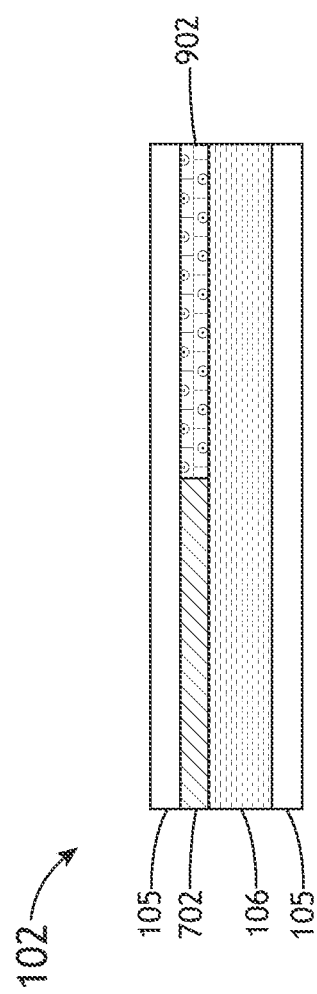
FIG. 18 is an exemplary embodiment of a memristor according to the inventive concepts disclosed herein.

Referring now to FIG. 18, an exemplary embodiment of at least one memristor 102 according to the inventive concepts disclosed herein is depicted. The memristor 102 may be implemented similarly and function similarly to the memristor of FIG. 11, except that in FIG. 18: the memristor 102 includes a permanent modification material 902 and a transfer rate modification material 702; the permanent modification material 902 may be positioned between the first conductive plate 105 (A) and the second conductive plate 105 (B); the transfer rate modification material 702 may be positioned between the first conductive plate 105 (A) and the second conductive plate 105 (B); the permanent modification material 902 and the transfer rate modification material 702 may be in parallel electrically; at least a portion of the permanent modification material 902 may abut the memristor material 106; at least a portion of the transfer rate modification material 702 may abut the memristor material 106; a combination of the permanent modification material 902 and the transfer modification material 702 may provide a modification to the output signal after a signal is driven from the second conductive plate 105 (B) to the first conductive plate 105 (A).

Figure 19:
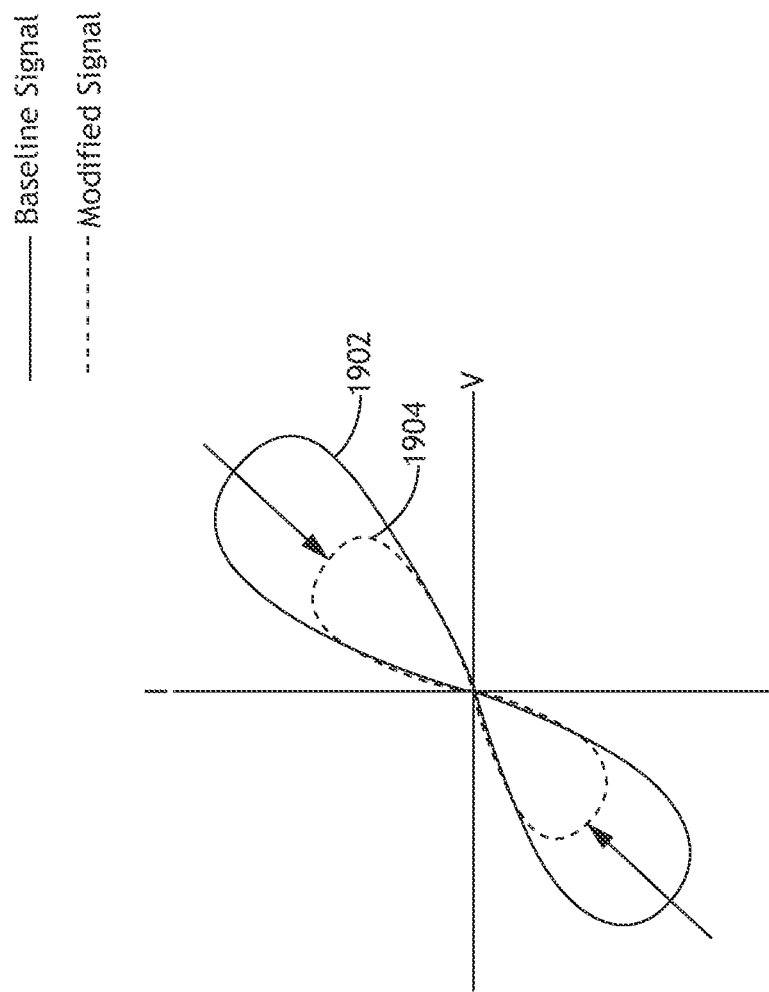
FIG. 19 is an exemplary graph according to the inventive concepts disclosed herein.

Referring now to FIG. 19, an exemplary graph of current (I) versus voltage (V) is shown. The graph shows a first I-V curve 1902 and a second I-V curve 1904. The first I-V curve 1902 is associated with a baseline signal (e.g., an unmodified signal) of a memristor 102 as shown in FIG. 1A. The second I-V curve 1904 may be an I-V curve for the output signal of the memristor 102 of FIG. 18.

In some embodiments, the system 100 may include a memristor network 114 having any combination of type and/or number of at least two memristors 102, such as shown in FIGS. 1A, 2, 3, 4, 7, 9, 11, 13, 14, 15, 16, and/or 18.

Figure 20:
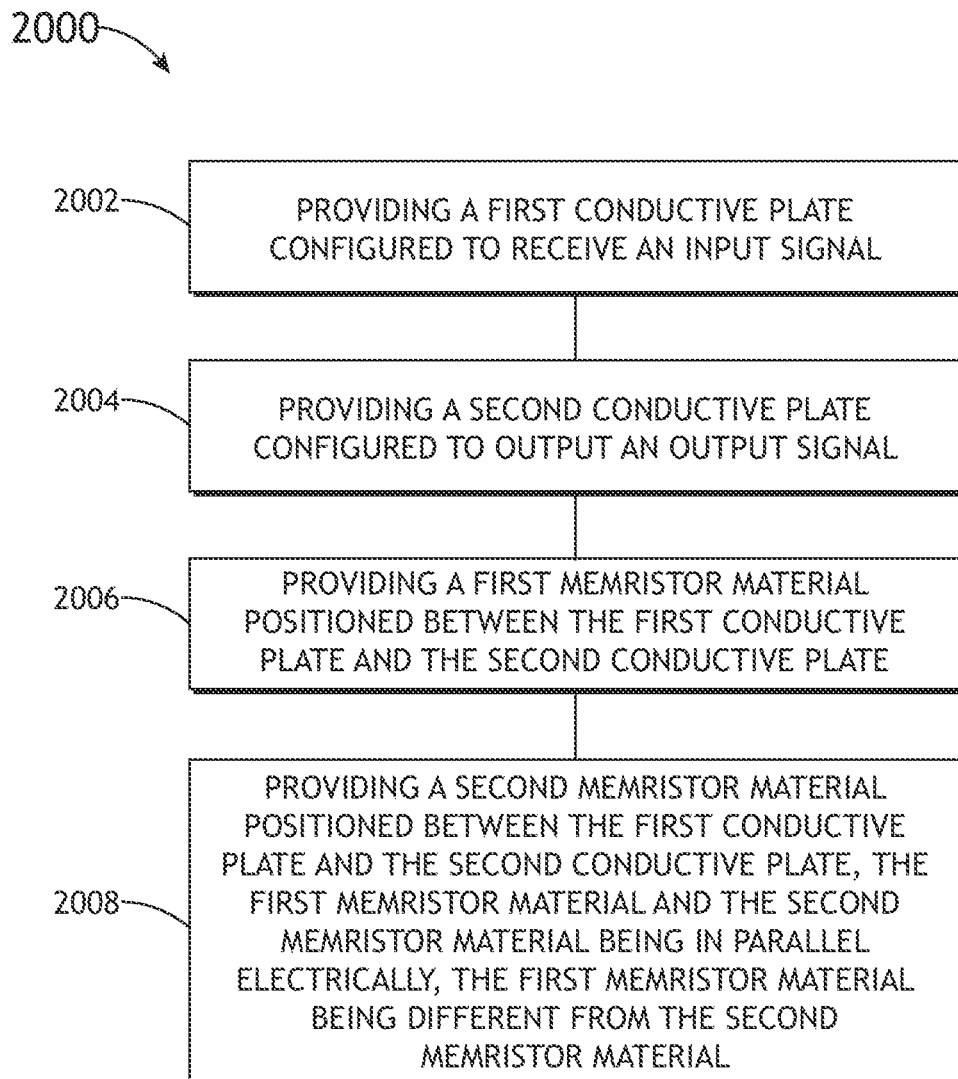
FIG. 20 is a diagram of an exemplary embodiment of a method according to the inventive concepts disclosed herein.

Referring now to FIG. 20, an exemplary embodiment of a method 2000 according to the inventive concepts disclosed herein may include one or more of the following steps. Additionally, for example, some embodiments may include performing one more instances of the method 2000 iteratively, concurrently, and/or sequentially. Additionally, for example, at least some of the steps of the method 2000 may be performed in parallel and/or concurrently. Additionally, in some embodiments, at least some of the steps of the method 2000 may be performed non-sequentially. Additionally, in some embodiments, at least some of the steps of the method 2000 may be performed in sub-steps of providing various components. In some embodiments, the method 2000 may be performed by a semiconductor fab tool(s).

A step 2002 may include providing a first conductive plate configured to receive an input signal.

A step 2004 may include providing a second conductive plate configured to output an output signal.

A step 2006 may include providing a first memristor material positioned between the first conductive plate and the second conductive plate.

A step 2008 may include providing a second memristor material positioned between the first conductive plate and the second conductive plate, the first memristor material and the second memristor material being in parallel electrically, the first memristor material being different from the second memristor material.

Further, the method 2000 may include any of the operations disclosed throughout.

Figure 21:
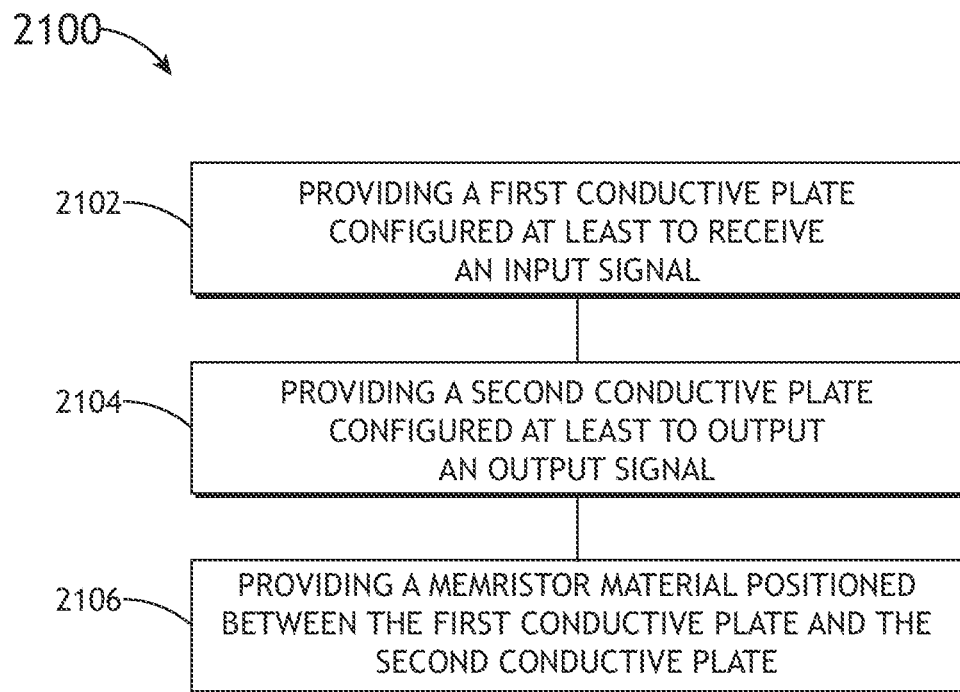
FIG. 21 is a diagram of an exemplary embodiment of a method according to the inventive concepts disclosed herein.

Referring now to FIG. 21, an exemplary embodiment of a method 2100 according to the inventive concepts disclosed herein may include one or more of the following steps. Additionally, for example, some embodiments may include performing one more instances of the method 2100 iteratively, concurrently, and/or sequentially. Additionally, for example, at least some of the steps of the method 2100 may be performed in parallel and/or concurrently. Additionally, in some embodiments, at least some of the steps of the method 2100 may be performed non-sequentially. Additionally, in some embodiments, at least some of the steps of the method 2100 may be performed in sub-steps of providing various components. In some embodiments, the method 2100 may be performed by a semiconductor fab tool(s).

A step 2102 may include providing a first conductive plate configured at least to receive an input signal.

A step 2104 may include providing a second conductive plate configured at least to output an output signal.

A step 2106 may include providing a memristor material positioned between the first conductive plate and the second conductive plate.

Further, the method 2100 may include any of the operations disclosed throughout.

Referring now to FIGS. 22-28, further exemplary embodiments of the system 100 including an array of interconnected memristors 2204 according to the inventive concepts disclosed herein are depicted.

Figure 22:
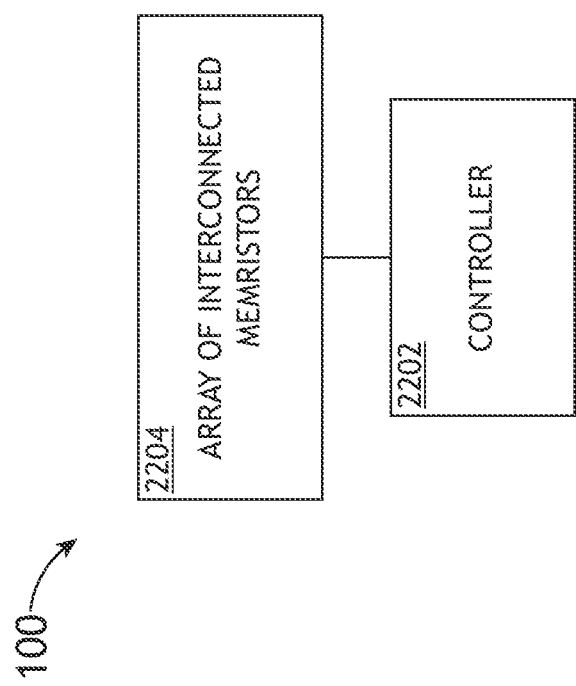
FIG. 22 is a view of an exemplary embodiment of the system of FIG. 1A including multi-lead memristors according to the inventive concepts disclosed herein.

Referring now to FIG. 22, an exemplary embodiment of the system 100 according to the inventive concepts disclosed herein is depicted. The system 100 may include at least one memristor network 114 (e.g., at least one array of interconnected memristors 2204) and at least one controller 2202, which may be communicatively coupled. The array of interconnected memristors 2204 may include any or all of the elements and/or any or all of the arrangement of the elements described with respect to the memristor network 114 (e.g., including any of various embodiments of memristors 102), as disclosed throughout.

The at least one controller 2202 may function similarly to the processor 110. The at least one controller 2202 may be configured to perform (e.g., collectively perform if more than one controller) any or all of the operations disclosed throughout. The controller 2202 may be configured to run various software and/or firmware applications and/or computer code stored (e.g., maintained) in a non-transitory computer-readable medium and configured to execute various instructions or operations. For example, the controller 2202 may be configured to tune (e.g., set a state(s) of any or all of the memristors 102 of the array 2204 and/or read a state(s) of any or all of the memristors 102 of the array 2204) the array of interconnected memristors 2204.

In some embodiments, the array of interconnected memristors 2204 may have a customizable output response that may be pre-defined and/or controlled by the controller 2202. In some embodiments, controller 2202 may be configured to modify memristors 102 of the array of interconnected memristors 2204 at key interfaces such that the output response can be tailored electrical needs of a circuit. In some embodiments, the array of interconnected memristors 2204 may include a relatively large grid of memristors 102 or a smaller arrangement of memristors 102. In some embodiments, the array of interconnected memristors 2204 may be a tunable circuit and/or a tunable memristor based logic network through the use of additive or semi-additive processes. Some embodiments may include a closely integrated memristor logic network. Some embodiments may allow for elimination of the need of multiple discrete components and substrate carriers. Some embodiments may allow for additive construction of unique optimized circuit networks. Some embodiments may allow for size reduction of packaged circuit through thin vapor deposited memristor networks.

Referring now to FIGS. 23-26, exemplary embodiments of an array of interconnected memristors 2204 according to the inventive concepts disclosed herein are depicted. In some embodiments, the array of interconnected memristors 2204 may be one-dimensional (1D), two-dimensional (2D), 2.5-dimensional (2.5D), or three-dimensional (3D).

Figure 23:
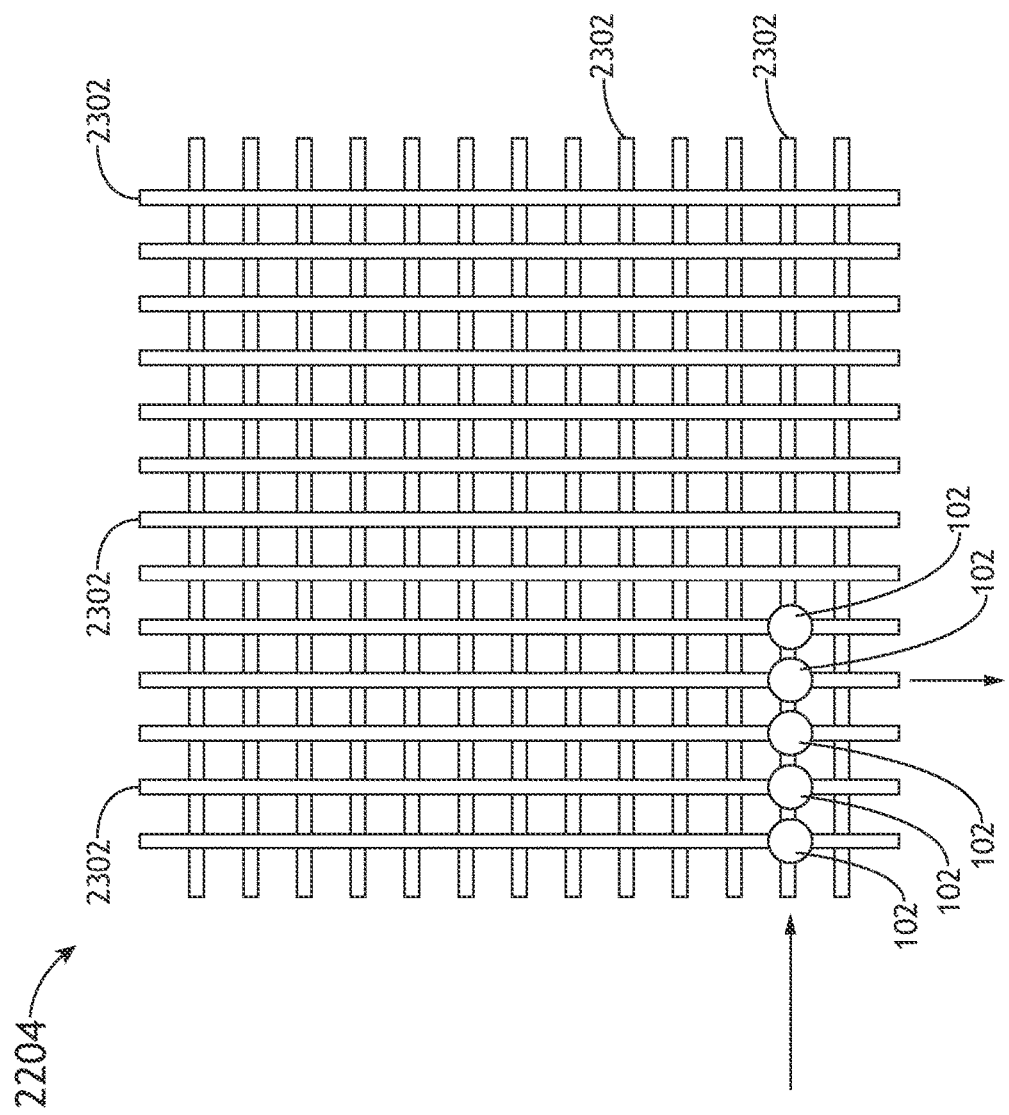
FIG. 23 is an exemplary embodiment of a 2D array of interconnected memristors of FIG. 22 according to the inventive concepts disclosed herein.
Figure 24:
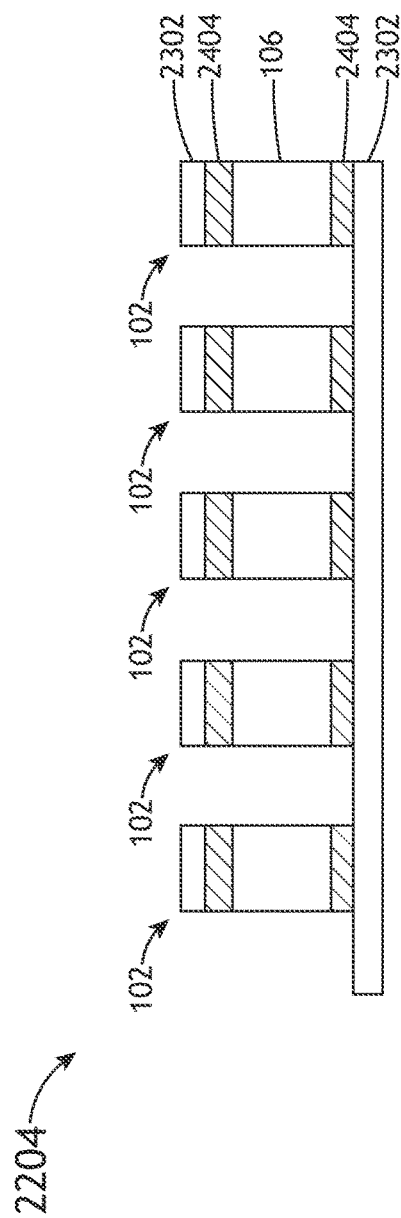
FIG. 24 is a side view of an exemplary embodiment of a 1D or 2D array of interconnected memristors of FIG. 22 according to the inventive concepts disclosed herein.

Referring now to FIG. 23, an exemplary embodiment of a 2D array of interconnected memristors 2204 according to the inventive concepts disclosed herein is depicted. The array of interconnected memristors 2204 may include memristors 102 and conductive paths 2302 (e.g., traces). Each memristor 102 of the array 2204 may be connected to a first particular conductive path 2302 at a first electrode (e.g., 2404, as shown in FIG. 24) and to a second particular conductive path 2302 at a second electrode (e.g., 2404, as shown in FIG. 24). Each of the conductive paths 2302 may be connected to the controller 2202. For example, the array of interconnected memristors 2204 may be an interconnected circuit lattice that has unique pre-defined and/or controlled random memristors 102 at connection interfaces. For example, the controller 2202 may be configured to change an order of activation of the array of interconnected memristors 2204 to output a unique response(s) based on the order of activation and/or based on which lead combination is selected through an initial activation phase and/or a secondary interaction(s). Any or all of the intersections of conductive paths 2302 may include a memristor 102 (e.g., a uniformly configured memristor or a unique memristor). For example, each memristor 102 of the array of interconnected memristors 2204 may have a same memristance value or a different memristance value as another memristor 102 of the array 2204. For example, the memristors 102 may have various memristor values selected specifically for an application or various values such that a broad range could be selected (e.g., similar to a decade box, except with memristors 102 rather than resistors). In some embodiments, the controller 2202 may be configured to electrically select which memristors 102 are being used in parallel or series and tune the circuit as needed.

Referring now to FIG. 24, a side view of an exemplary embodiment of a 1D or 2D array of interconnected memristors 2204 according to the inventive concepts disclosed herein is depicted. The array of interconnected memristors 2204 may include memristors 102, each coupled between two conductive paths 2302 (e.g., traces). Each memristor may include a first electrode 2404 (e.g., a conductive plate 105), a second electrode 2404 (e.g., a conductive plate 105), and at least one memristor material 106 positioned between the first electrode 2404 and the second electrode 2404.

In some embodiments, at least one first memristor material 106 of a first given memristor 102 of the array of interconnected memristors 2204 may include a first memristor material 106, at least one second memristor material 106 of a second given memristor 102 of the array of interconnected memristors 2204 may include a second memristor material 106, and the first memristor material 106 may be a same or different material from the second memristor material 106.

Figure 25:
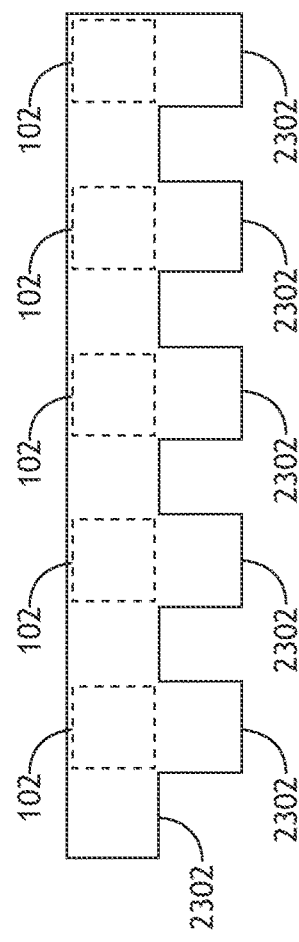
FIG. 25 is a top view of an exemplary embodiment of a 1D array of interconnected memristors of FIG. 22 according to the inventive concepts disclosed herein.

Referring now to FIG. 25, a top view of an exemplary embodiment of a 1D array of interconnected memristors 2204 according to the inventive concepts disclosed herein is depicted.

Figure 26:
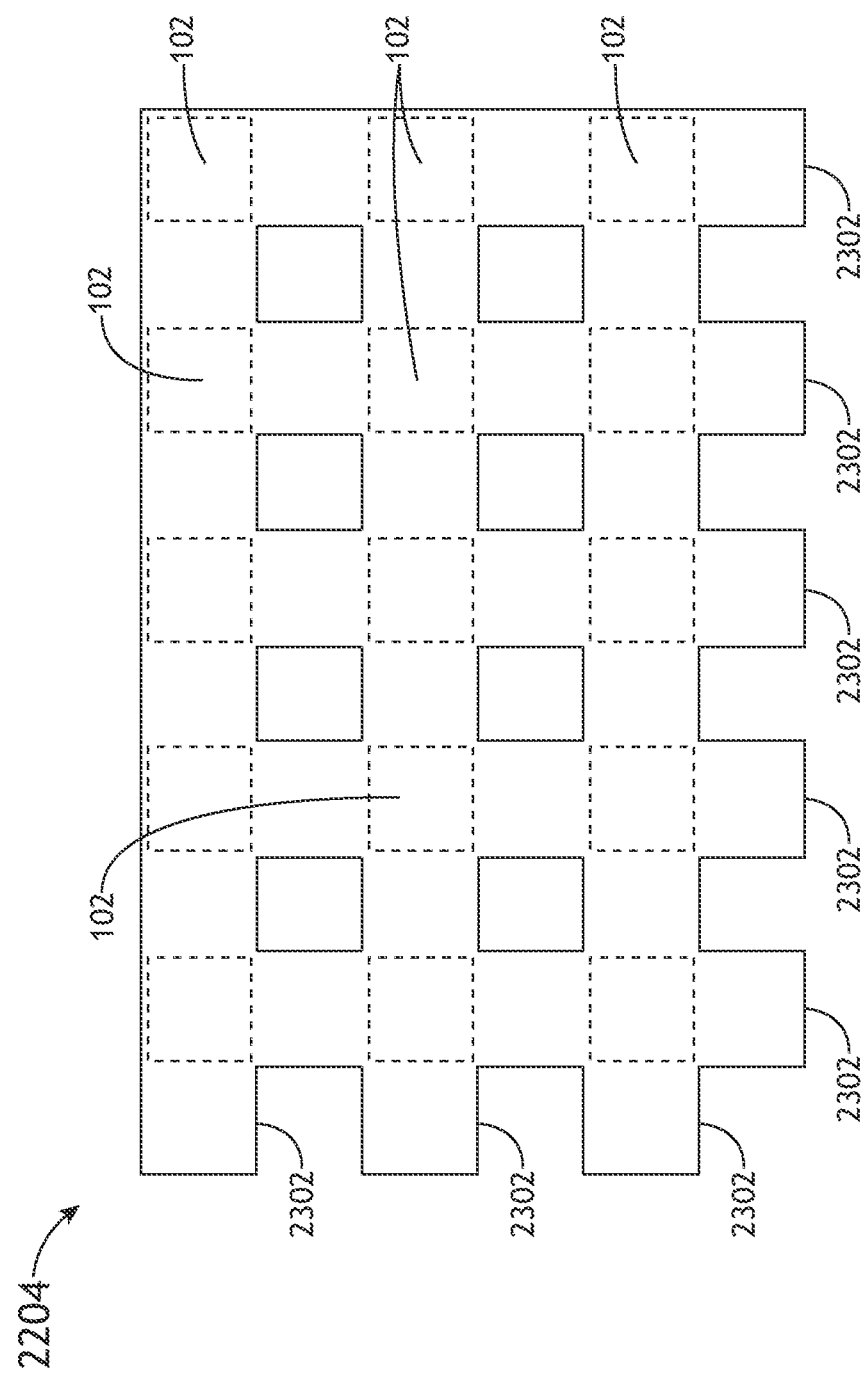
FIG. 26 is a top view of an exemplary embodiment of a 2D array of interconnected memristors of FIG. 22 according to the inventive concepts disclosed herein.

Referring now to FIG. 26, a top view of an exemplary embodiment of a 2D array of interconnected memristors 2204 according to the inventive concepts disclosed herein is depicted.

Figure 27:
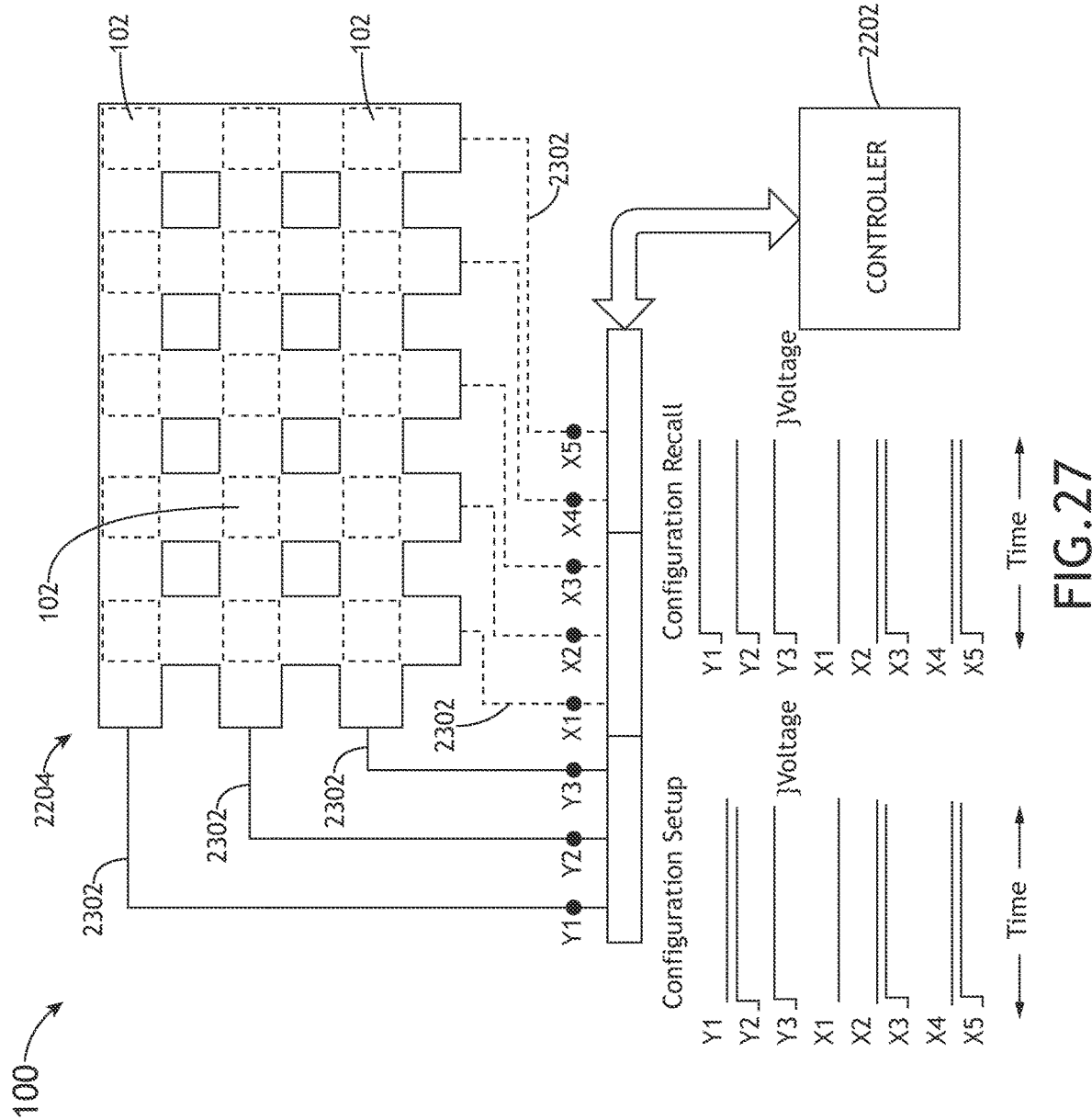
FIG. 27 is a view of an exemplary embodiment of the system of FIG. 22 including multi-lead memristors according to the inventive concepts disclosed herein.

Referring now to FIG. 27, an exemplary embodiment of the system 100 according to the inventive concepts disclosed herein is depicted. The system 100 may include the array of interconnected memristors 2204 electrically coupled to the controller 2202. The controller 2202 may be configured to tune (e.g., set a state(s) of any or all of the memristors 102 of the array 2204 and/or read a state(s) of any or all of the memristors 102 of the array 2204) the array of interconnected memristors 2204. Setting a state(s) of any or all of the memristors 102 of the array 2204 may be referred to as configuration setup. Reading a state(s) of any or all of the memristors 102 of the array 2204 may be referred to as configuration recall.

For example, for configuration setup, the various memristors 102 of the array 2204 may be set to a state(s) by driving individual sets of one X and one Y conductive path 2302 to opposite voltages: e.g., X is high (Vdd) and Y is ground, or vice-versa. For example, the controller 2202 may apply the voltage to the memristor 102 long enough for all electrons to migrate to one side of the memristor 102 and until current has stopped flowing. The X-Y conductive paths 2302 may then be set to ground.

For example, for configuration recall, a memristor 102 of the array 2204 may be read by driving the Y conductive path high while driving the X conductive path low and checking for current flow. For example, if the memristor 102 had been set Y=high, X=low, then no current will flow as the same voltage is being applied as during the configuration setup process and all of the electrons will have already migrated. Likewise, for example, if the node had been set Y=low, X=high, then current flow will be high as the opposite voltage is being applied as during the configuration setup process and causing high electron migration. Note that during the configuration recall cycle, the Y conductive path 2302 may be driven high for a short time, such that there is not enough time for a significant quantity of electrons to migrate during the measurement cycle. Therefore, current flow may be high for a short duration of the configuration recall cycle.

For example, for a given memristor 102 of the array of interconnected memristors 2204, the controller 2202 may be configured to set a state of the given memristor 102 by driving a voltage to one of the first conductive path 2302 and the second conductive path 2302 while the other of the first conductive path 2302 and the second conductive path 2302 is a ground. The controller 2202 may be further configured to set the state of the given memristor 102 by applying the voltage to the one of the first conductive path 2302 and the second conductive path 2302 while the other of the first conductive path 2302 and the second conductive path 2302 is the ground until a steady state has been reached where electrons have migrated to one side of the at least one memristor material 106. Once the steady state is reached, the controller 2202 may be further configured to set each of the first conductive path 2302 and the second conductive path 2302 to ground. For the given memristor 102 of the array of interconnected memristors 2204, the controller 2202 may be configured to read the given memristor 102 by driving a voltage to the other of the first conductive path 2302 and the second conductive path 2302 while the one of the first conductive path 2302 and the second conductive path 2302 is a ground. In some embodiments, the controller 2202 may be configured to set states of one, some, or all of the memristors 102 of the array of interconnected memristors 2204 and to read one, some, or all of the memristors 102 of the array of interconnected memristors 2204.

In some embodiments, the controller 2202 may be configured to customizably control an output response of the array of interconnected memristors 2204.

In some embodiments, the array of interconnected memristors 2204 may act as a tunable logic network.

In some embodiments, the controller 2202 may be configured to tune the array of interconnected memristors 2204 such that the array of interconnected memristors 2204 acts as a selectable resistor network having differently sized resistors for test selecting the resistors to tune a mixed signal circuit.

In some embodiments, the array of interconnected memristors 2204 acts as a trimmer capacitor.

Referring now to FIG. 28, an exemplary embodiment of a method 2800 according to the inventive concepts disclosed herein may include one or more of the following steps. Additionally, for example, some embodiments may include performing one more instances of the method 2800 iteratively, concurrently, and/or sequentially. Additionally, for example, at least some of the steps of the method 2800 may be performed in parallel and/or concurrently. Additionally, in some embodiments, at least some of the steps of the method 2800 may be performed non-sequentially. Additionally, in some embodiments, at least some of the steps of the method 2800 may be performed in sub-steps of providing various components.

A step 2802 may include tuning, by a controller communicatively coupled to an array of interconnected memristors, the array of interconnected memristors, each memristor comprising: a first electrode; a second electrode; and at least one memristor material positioned between the first electrode and the second electrode.

Further, the method 2800 may include any of the operations disclosed throughout.

As will be appreciated from the above, embodiments of the inventive concepts disclosed herein may be directed to a method and a system including at least one device (e.g., at least one memristor) having at least one memristor material.

As used throughout and as would be appreciated by those skilled in the art, "at least one non-transitory computer-readable medium" may refer to as at least one non-transitory computer-readable medium (e.g., at least one memory device (e.g., a non-volatile memory device); e.g., at least one memristor; e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one read-only memory (ROM) (e.g., at least one electrically erasable programmable read-only memory (EEPROM)), at least one on-processor memory (e.g., at least one on-processor cache, at least one on-processor buffer, at least one on-processor flash memory, at least one on-processor EEPROM, or a combination thereof), or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof), or a combination thereof).

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A system, comprising:
an array of interconnected memristors, each memristor comprising:
  a first electrode;
  a second electrode; and
  at least one memristor material positioned between the first electrode and the second electrode; and
a controller communicatively coupled to the array of interconnected memristors, wherein the controller is configured to tune the array of interconnected memristors,
wherein the array of interconnected memristors includes conductive paths such that each memristor of the array is connected to a first conductive path of the conductive paths at the first electrode and to a second conductive path of the conductive paths at the second electrode, wherein the conductive paths are further connected to the controller,
wherein, for a given memristor of the array of interconnected memristors, the controller is configured to set a state of the given memristor by driving a voltage to one of the first conductive path and the second conductive path while the other of the first conductive path and the second conductive path is a ground,
wherein the controller is further configured to set the state of the given memristor by applying the voltage to the one of the first conductive path and the second conductive path while the other of the first conductive path and the second conductive path is the ground until a steady state has been reached where electrons have migrated to one side of the at least one memristor material,
wherein, once the steady state is reached, the controller is further configured to set each of the first conductive path and the second conductive path to ground,
wherein, for the given memristor of the array of interconnected memristors, the controller is configured to read the given memristor by driving another voltage to the other of the first conductive path and the second conductive path while the one of the first conductive path and the second conductive path is another ground, wherein the controller is configured to tune the array of interconnected memristors such that the array of interconnected memristors acts as a selectable resistor network having differently sized resistors for test selecting the resistors to tune a mixed signal circuit.

2. The system of claim 1, wherein at least one first memristor material of a first given memristor of the array of interconnected memristors includes a first memristor material, wherein at least one second memristor material of a second given memristor of the array of interconnected memristors includes a second memristor material, wherein the first memristor material is a same or different material from the second memristor material.

3. The system of claim 1, wherein the array of interconnected memristors is a one-dimensional array of interconnected memristors.

4. The system of claim 1, wherein the array of interconnected memristors is a two-dimensional array of interconnected memristors.

5. The system of claim 1, wherein the controller is configured to set states of all of the memristors of the array of interconnected memristors and to read all of the memristors of the array of interconnected memristors.

6. The system of claim 1, wherein the controller is configured to, in a customizable manner, control an output response of the array of interconnected memristors.

7. The system of claim 1, wherein the array of interconnected memristors acts as a tunable logic network.

8. The system of claim 1, wherein the array of interconnected memristors acts as a trimmer capacitor.

9. A method, comprising:

tuning, by a controller communicatively coupled to an array of interconnected memristors, the array of interconnected memristors, each memristor comprising: a first electrode; a second electrode; and at least one memristor material positioned between the first electrode and the second electrode, wherein the array of interconnected memristors includes conductive paths such that each memristor of the array is connected to a first conductive path of the conductive paths at the first electrode and to a second conductive path of the conductive paths at the second electrode, wherein the conductive paths are further connected to the controller, wherein, for a given memristor of the array of interconnected memristors, the controller is configured to set a state of the given memristor by driving a voltage to one of the first conductive path and the second conductive path while the other of the first conductive path and the second conductive path is a ground, wherein the controller is further configured to set the state of the given memristor by applying the voltage to the one of the first conductive path and the second conductive path while the other of the first conductive path and the second conductive path is the ground until a steady state has been reached where electrons have migrated to one side of the at least one memristor material, wherein, once the steady state is reached, the controller is further configured to set each of the first conductive path and the second conductive path to ground, wherein, for the given memristor of the array of interconnected memristors, the controller is configured to read the given memristor by driving another voltage to the other of the first conductive path and the second conductive path while the one of the first conductive path and the second conductive path is another ground, wherein the controller is configured to tune the array of interconnected memristors such that the array of interconnected memristors acts as a selectable resistor network having differently sized resistors for test selecting the resistors to tune a mixed signal circuit.

* * * * *